(12) United States Patent
Ware

(10) Patent No.: US 8,593,885 B2
(45) Date of Patent: Nov. 26, 2013

(54) STAGGERED MODE TRANSITIONS IN A SEGMENTED INTERFACE

(75) Inventor: Frederick A. Ware, Los Altos Hills, CA (US)

(73) Assignee: Rambus Inc., Sunnyvale, CA (US)

( * ) Notice: Subject to any disclaimer, the term of this patent is extended or adjusted under 35 U.S.C. 154(b) by 104 days.

(21) Appl. No.: 13/411,402

(22) Filed: Mar. 2, 2012

(65) Prior Publication Data

US 2012/0236659 A1 Sep. 20, 2012

Related U.S. Application Data

(60) Provisional application No. 61/454,461, filed on Mar. 18, 2011.

(51) Int. Cl.
*G11C 7/10* (2006.01)
*G06F 13/00* (2006.01)

(52) U.S. Cl.
USPC ............... 365/189.02; 365/189.18; 711/167; 711/168

(58) Field of Classification Search
USPC .................................. 365/189.02
See application file for complete search history.

(56) References Cited

U.S. PATENT DOCUMENTS 7,296,124 B1 * 11/2007 Falik ........................... 711/157
8,261,039 B2 * 9/2012 Perego et al. ................ 711/170

OTHER PUBLICATIONS

U.S. Appl. No. 61/411,897, filed Nov. 9, 2010, pp. 1-33, drawing sheets pp. 1-10.

* cited by examiner

*Primary Examiner* — Son Mai
(74) *Attorney, Agent, or Firm* — Steven J. Cahill

(57) ABSTRACT

A memory integrated circuit comprises first and second memory arrays and first and second interfaces. The first interface receives a signal for accessing a memory location in one of the first and the second memory arrays during a first time interval. The second interface receives a signal for accessing a memory location in one of the first and the second memory arrays during the first time interval. The first interface receives signals for accessing memory locations in the first and the second memory arrays, and the second interface is disabled from accessing the first and the second memory arrays during the second time interval. A signaling rate of a signal received by the second interface, a supply voltage of the second interface, an on-chip termination impedance of the second interface, or a voltage amplitude of a signal received by the second interface is adjusted during the second time interval.

21 Claims, 20 Drawing Sheets

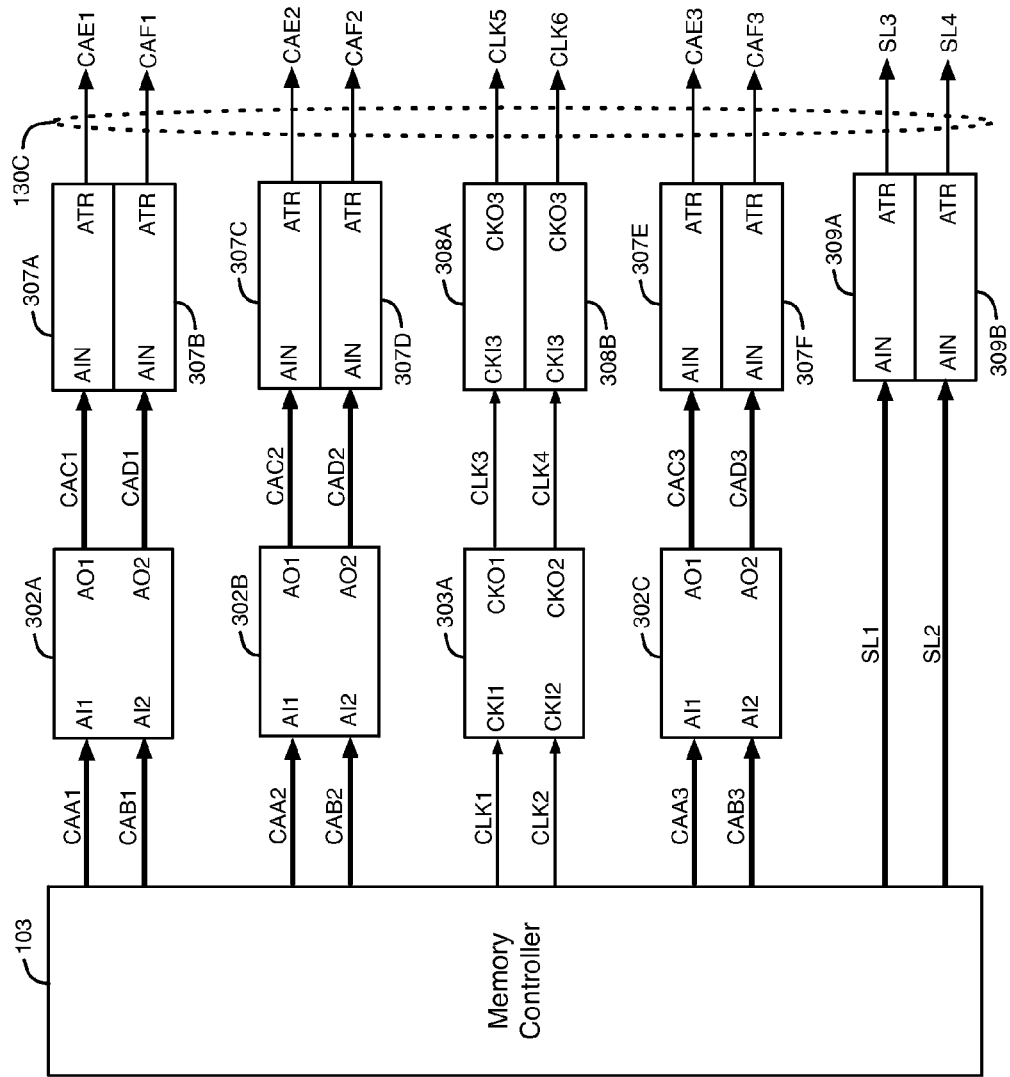

STAGGERED MODE TRANSITIONS IN A SEGMENTED INTERFACE

CROSS REFERENCE TO RELATED APPLICATION

This patent application claims the benefit of U.S. provisional patent application 61/454,461, filed Mar. 18, 2011, which is incorporated by reference herein in its entirety.

BACKGROUND

The present disclosure relates to electronic circuits, and more particularly, to techniques for providing staggered mode transitions in a segmented interface.

In many computing systems, a processor integrated circuit stores data in a separate memory integrated circuit. Data and addresses for read and write requests to the memory integrated circuit are transmitted between the processor integrated circuit and the memory integrated circuit through conductors that are external to both integrated circuits.

BRIEF DESCRIPTION OF THE DRAWINGS

FIGS. 4A, 5A, and 6A illustrate additional details of circuits and signals in the processor integrated circuit.

DETAILED DESCRIPTION

The instant description is directed to method and apparatus embodiments of a memory device (i.e., an integrated circuit memory device) and an integrated circuit device which controls the memory device (e.g., a memory controller or a processor). In various embodiments described, the processor controls various operating modes or states in which different power consumption profiles are effectuated by the memory device. While transitioning between different operating modes (e.g., to a low power mode), the processor and memory integrated circuits may change one or more operating parameters that affect the transmission of signals between the interface circuits. If all of the interface circuits in the processor and memory integrated circuits are disabled while the integrated circuits transition to a different operating mode, read and write requests to the memory integrated circuit accumulate in the processor integrated circuit until signal transmission resumes. If the number of accumulated read and write requests is too large to store in the processor integrated circuit, the processor integrated circuit may reduce its processing capabilities, until data transmission with the memory integrated circuit resumes.

According to embodiments described below, interface circuits in each of the processor and memory integrated circuits transition to different modes of operation at different times. A first set of the interface circuits in the processor integrated circuit and a first set of the interface circuits in the memory integrated circuit transition to a different operating mode during a first time interval. The first sets of interface circuits do not transmit signals for read and write requests during the first time interval. Signals for read and write requests are transmitted between the processor and memory integrated circuits using a second set of the interface circuits in the processor integrated circuit and a second set of the interface circuits in the memory integrated circuit during the first time interval.

The second set of the interface circuits in the processor integrated circuit and the second set of the interface circuits in the memory integrated circuit transition to a different operating mode during a second time interval after the first time interval. The second sets of interface circuits do not transmit signals for read and write requests during the second time interval. Signals for read and write requests are transmitted between the processor and memory integrated circuits using the first set of the interface circuits in the processor integrated circuit and the first set of the interface circuits in the memory integrated circuit during the second time interval.

Figure 1:
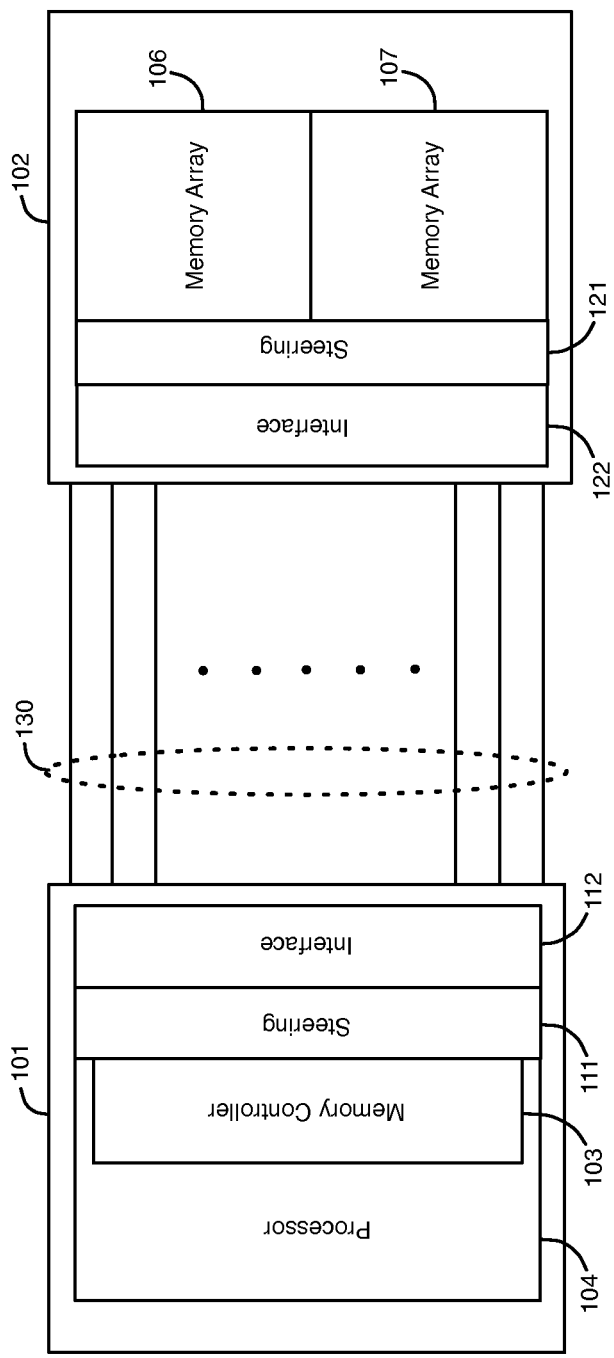
FIG. 1 illustrates an example of a processor integrated circuit and a memory integrated circuit that are coupled together through external conductors.

FIG. 1 illustrates an example of a processor integrated circuit 101 and a memory integrated circuit 102 that are coupled together through external conductors 130. Processor integrated circuit 101 includes a processor circuit 104, steering circuits 111, and interface circuits 112. Processor circuit 104 includes a memory controller logic 103. Memory integrated circuit 102 includes memory array circuits 106-107, steering circuits 121, and interface circuits 122. Processor circuit 104 is a core circuit in processor integrated circuit 101, and memory array circuits 106-107 are core circuits in memory integrated circuit 102. In other embodiments, processor integrated circuit 101 has multiple processor core circuits, and memory integrated circuit 102 has three or more memory array circuits. In an embodiment, each of memory array circuits 106-107 has multiple banks of memory circuits. Memory array circuits 106-107 may include any memory cell technology such as, for example, synchronous dynamic access memory (DRAM), static random access memory (SRAM), flash, etc. As more specific examples, memory devices may be double data rate (DDR) SDRAM, extreme data rate (XDR), or Mobile XDR devices.

Throughout this description, the processor integrated circuit is a specific example of an integrated circuit device (i.e., memory controller device) that includes an interface that communicates with an integrated circuit memory. Other types of memory controllers devices include mobile applications processors, application specific integrated circuits (ASIC), graphics processing units (GPU), field programmable gate arrays (FPGA), a system on chip (SoC) which may include processing cores or multimedia encode/decode functionality and multi-core processors as a sample set of examples.

Signals are transmitted between processor integrated circuit 101 and memory integrated circuit 102 through conductors 130. Conductors 130 may include transmission lines, wire bond connections, and/or solder bumps. Processor integrated circuit 101 and memory integrated circuit 102 may be stacked on top of each other and directly connected through solder bumps, connected together through a printed circuit board, or connected together through one or more packages.

Memory controller logic 103 issues write requests to write data to memory integrated circuit 102. Memory controller logic 103 issues read requests to read data from memory integrated circuit 102.

In response to each write request received from processor circuit 104, memory controller logic 103 generates write data and addresses that are provided to steering circuits 111. The addresses identify memory locations to store the write data in memory integrated circuit 102. Steering circuits 111 provide the write data and addresses to interface circuits 112. Interface circuits 112 transmit the write data and addresses through conductors 130 to interface circuits 122 in memory integrated circuit 102. Interface circuits 122 provide the write data and addresses to steering circuits 121. Steering circuits 121 provide the write data and addresses to a selected one of the memory array circuits 106 or 107. The selected memory array circuit 106 or 107 stores the write data at memory locations indicated by the addresses.

In response to each read request received from processor circuit 104, memory controller logic 103 generates addresses that are provided to steering circuits 111. The addresses identify memory locations that store read data in memory integrated circuit 102. Steering circuits 111 provide the addresses to interface circuits 112. Interface circuits 112 transmit the addresses through conductors 130 to interface circuits 122.

Interface circuits 122 provide the addresses to steering circuits 121. Steering circuits 121 provide the addresses to the memory array circuit 106 or 107 indicated by the addresses. The memory array circuit 106 or 107 accesses the read data from memory locations indicated by the addresses. The read data are provided to steering circuits 121. Steering circuits 121 provide the read data to interface circuits 122. Interface circuits 122 transmit the read data to interface circuits 112 through conductors 130. Interface circuits 112 provide the read data to steering circuits 111. Steering circuits 111 provide the read data to memory controller logic 103. Memory controller logic 103 provides the read data to processor circuit 104.

Processor integrated circuit 101 and memory integrated circuit 102 may change one or more operating parameters that affect the transmission of signals between these two integrated circuits. For example, processor integrated circuit 101 and memory integrated circuit 102 may change supply voltages, on-chip termination impedances at external pins, signal transmission rates of signals transmitted between the integrated circuits, or the voltage amplitudes of signals transmitted between the integrated circuits.

Processor integrated circuit 101 and/or memory integrated circuit 102 may reduce the supply voltages provided to interface circuits 112 and/or 122 during a low power mode to reduce power consumption. Interface circuits 112 and 122 may reduce the voltage amplitudes and/or the signaling rates of signals indicating the read data, the write data, and the addresses that are transmitted between processor integrated circuit 101 and memory integrated circuit 102 through conductors 130 during the low power mode. As another example, the on-chip termination impedances provided to pins coupled to conductors 130 may be recalibrated to reduce signal distortion.

According to some embodiments, signals are transmitted between processor integrated circuit 101 and memory integrated circuit 102 through only a subset of interface circuits 112 and through only a subset of interface circuits 122 while one or more operating parameters that affect the transmission of signals between these integrated circuits are changed in the remaining interface circuits 112 and 122. Thus, the transmission of signals continues between processor integrated circuit 101 and memory integrated circuit 102 through some of interface circuits 112 and 122, while operating parameters are changed in the remaining interface circuits 112 and 122.

Figure 2:
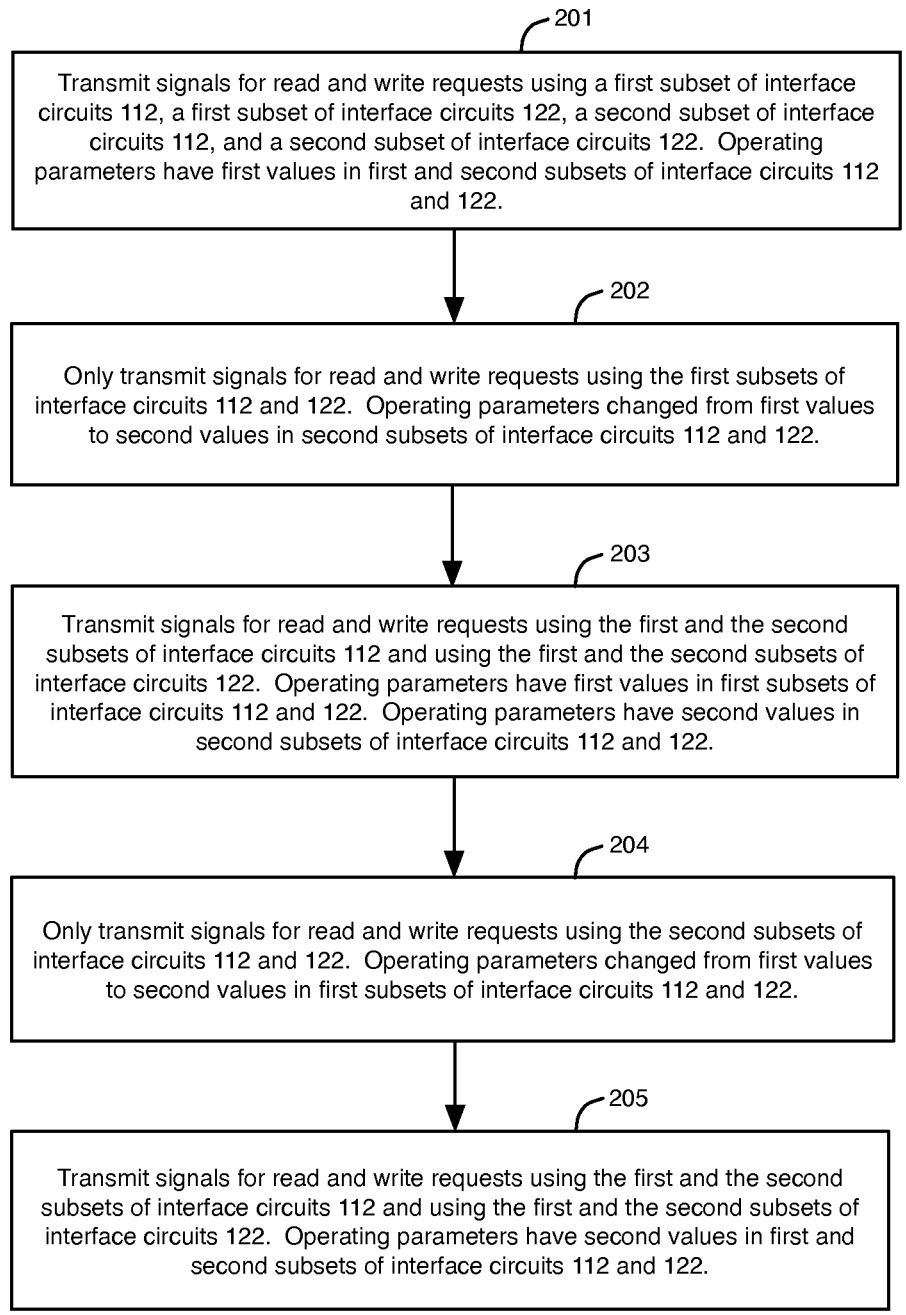
FIG. 2 is a flow chart illustrating operations performed by the processor integrated circuit and the memory integrated circuit that relate to changing one or more operating parameters affecting the transmission of signals between the integrated circuits.

FIG. 2 is a flow chart illustrating operations performed by processor integrated circuit 101 and memory integrated circuit 102 that relate to changing one or more operating parameters affecting the transmission of signals between the integrated circuits.

In operation 201, signals for read and write requests are transmitted between processor integrated circuit 101 and memory integrated circuit 102 using a first subset of interface circuits 112, a first subset of interface circuits 122, a second subset of interface circuits 112, and a second subset of interface circuits 122. The first and second subsets of interface circuits 112 may include all or less than all of interface circuits 112. The first and second subsets of interface circuits 122 may include all or less than all of interface circuits 122. The operating parameters that affect signal transmission between processor integrated circuit 101 and memory integrated circuit 102 have first values in operation 201 in a first mode in each of the first subsets of interface circuits 112 and 122 and in each of the second subsets of interface circuits 112 and 122.

In operation 202, signals for read and write requests are only transmitted between processor integrated circuit 101 and memory integrated circuit 102 using the first subset of interface circuits 112 and the first subset of interface circuits 122. In operation 202, the operating parameters that affect signal transmission have the first values in the first mode in the first subsets of interface circuits 112 and 122.

Also, in operation 202, one or more operating parameters that affect the transmission of signals between processor integrated circuit 101 and memory integrated circuit 102 are changed from the first values to second values in the second subset of interface circuits 112 and in the second subset of interface circuits 122. The second subsets of interface circuits 112 and 122 are in a second mode when the operating parameters have the second values. Signals are not transmitted between processor integrated circuit 101 and memory integrated circuit 102 using the second subsets of interface circuits 112 and 122 in operation 202.

In operation 203, signals for read and write requests are transmitted between processor integrated circuit 101 and memory integrated circuit 102 using the first and the second subsets of interface circuits 112 and using the first and the second subsets of interface circuits 122. In operation 203, the operating parameters that affect signal transmission in the first subsets of interface circuits 112 and 122 have the first values in the first mode. In operation 203, the operating parameters that affect signal transmission in the second subsets of interface circuits 112 and 122 have the second values in the second mode that were generated in operation 202.

In operation 204, signals for read and write requests are only transmitted between processor integrated circuit 101 and memory integrated circuit 102 using the second subset of interface circuits 112 and the second subset of interface circuits 122. In operation 204, the operating parameters that affect signal transmission in the second subset of interface circuits 112 and in the second subset of interface circuits 122 have the second values in the second mode that were generated in operation 202.

Also, in operation 204, one or more operating parameters that affect the transmission of signals between processor integrated circuit 101 and memory integrated circuit 102 are changed from the first values to the second values in the first subset of interface circuits 112 and in the first subset of interface circuits 122. The first subsets of interface circuits 112 and 122 are in the second mode when the operating parameters have the second values. Signals are not transmitted between processor integrated circuit 101 and memory integrated circuit 102 using the first subsets of interface circuits 112 and 122 in operation 204.

In operation 205, signals for read and write requests are transmitted between processor integrated circuit 101 and memory integrated circuit 102 using the first and the second subsets of interface circuits 112 and using the first and the second subsets of interface circuits 122. In operation 205, the operating parameters that affect signal transmission in the first and the second subsets of interface circuits 112 and in the first and the second subsets of interface circuits 122 have the second values in the second mode.

Figure 3A:
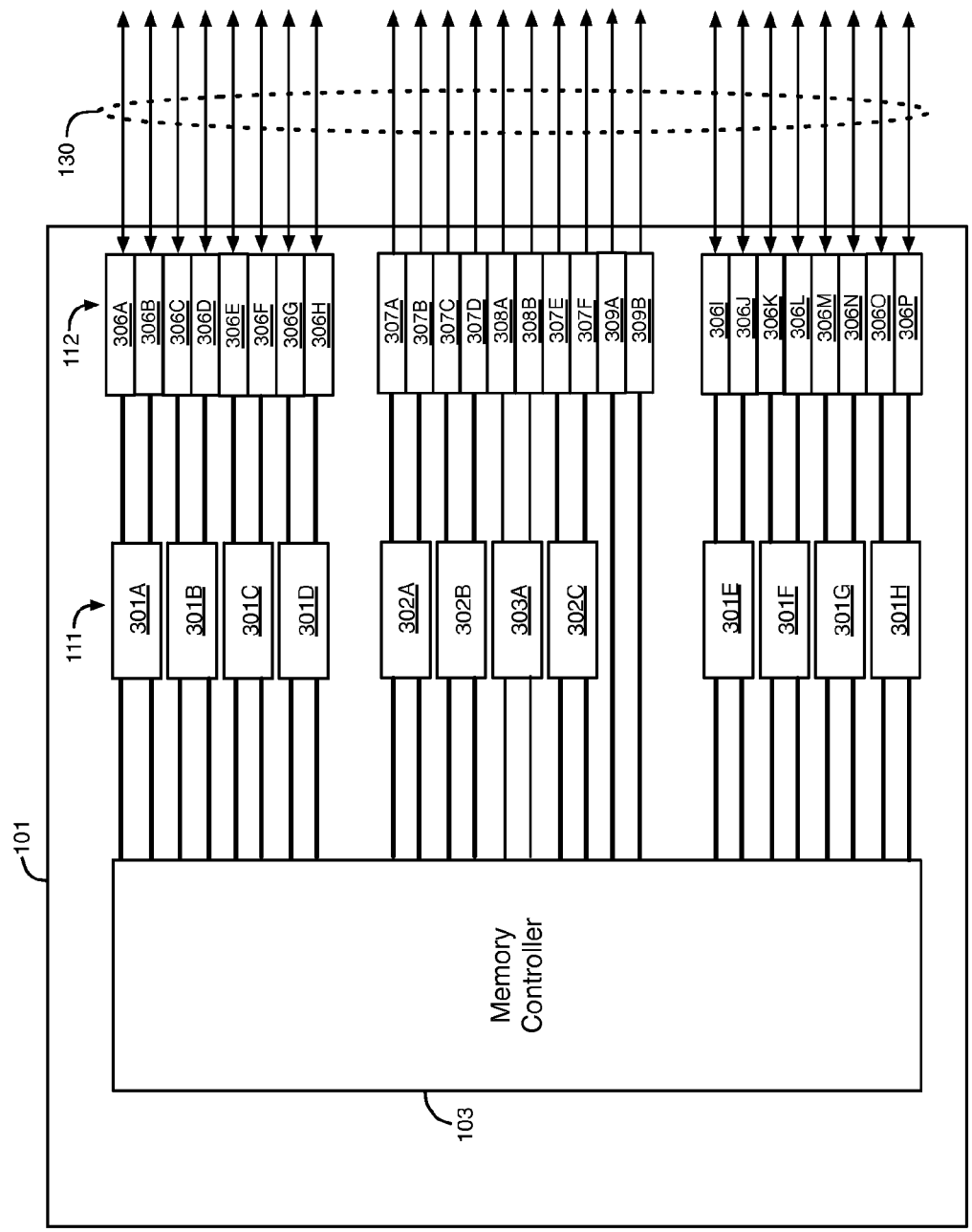
FIG. 3A illustrates additional circuitry in the processor integrated circuit.

FIG. 3A illustrates additional details of processor integrated circuit 101. As shown in FIG. 3A, steering circuits 111 include steering circuits 301A-301H, 302A-302C, and 303A. Interface circuits 112 include interface circuits 306A-306P, 307A-307F, 308A-308B, and 309A-309B.

Figure 3B:
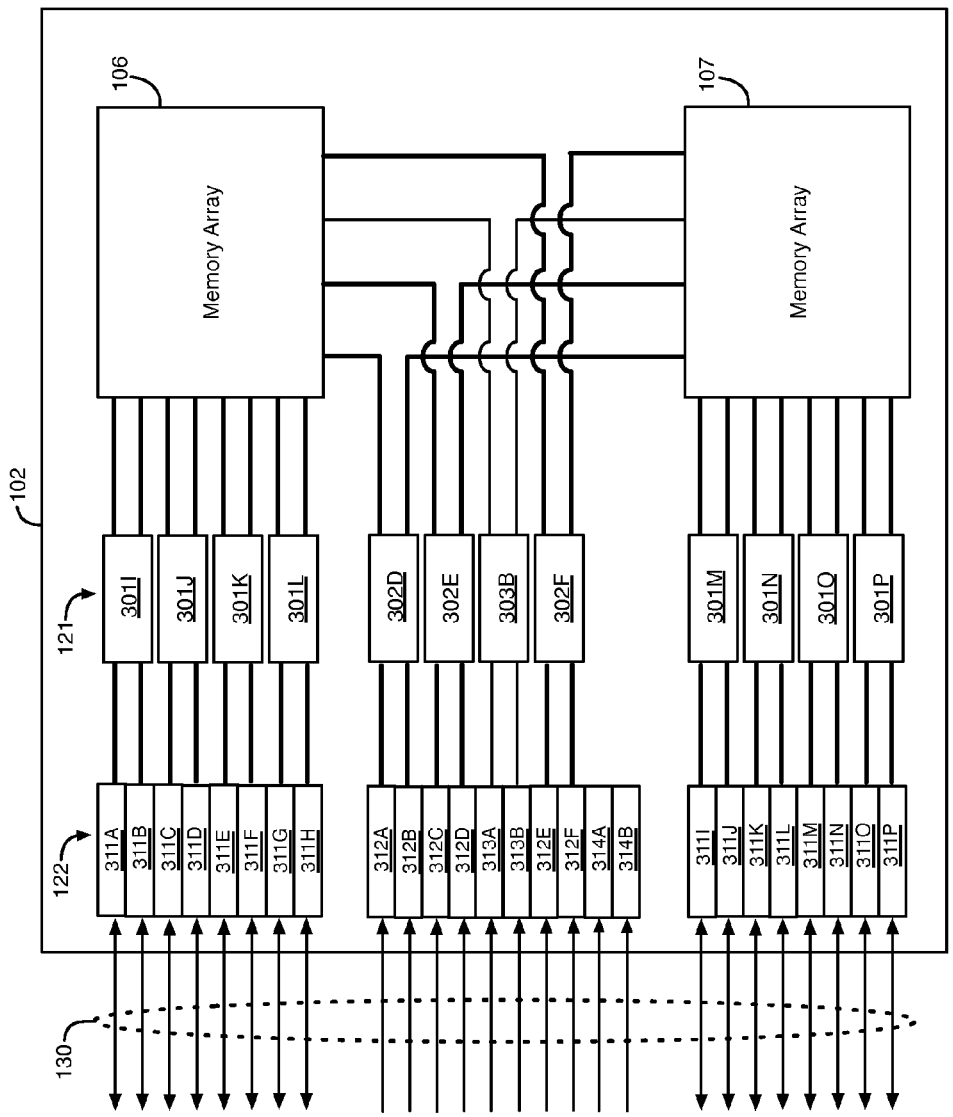
FIG. 3B illustrates additional circuitry in the memory integrated circuit.

FIG. 3B illustrates additional details of memory integrated circuit 102. As shown in FIG. 3B, interface circuits 122 include interface circuits 311A-311P, 312A-312F, 313A-313B, and 314A-314B. Signals are transmitted between interface circuits 112 and interface circuits 122 through conductors 130. Steering circuits 121 include steering circuits 301I-301P, 302D-302F, and 303B. Further details of integrated circuits 101-102 are shown in FIGS. 4A-4B, 5A-5B, and 6A-6B.

Figure 4A:
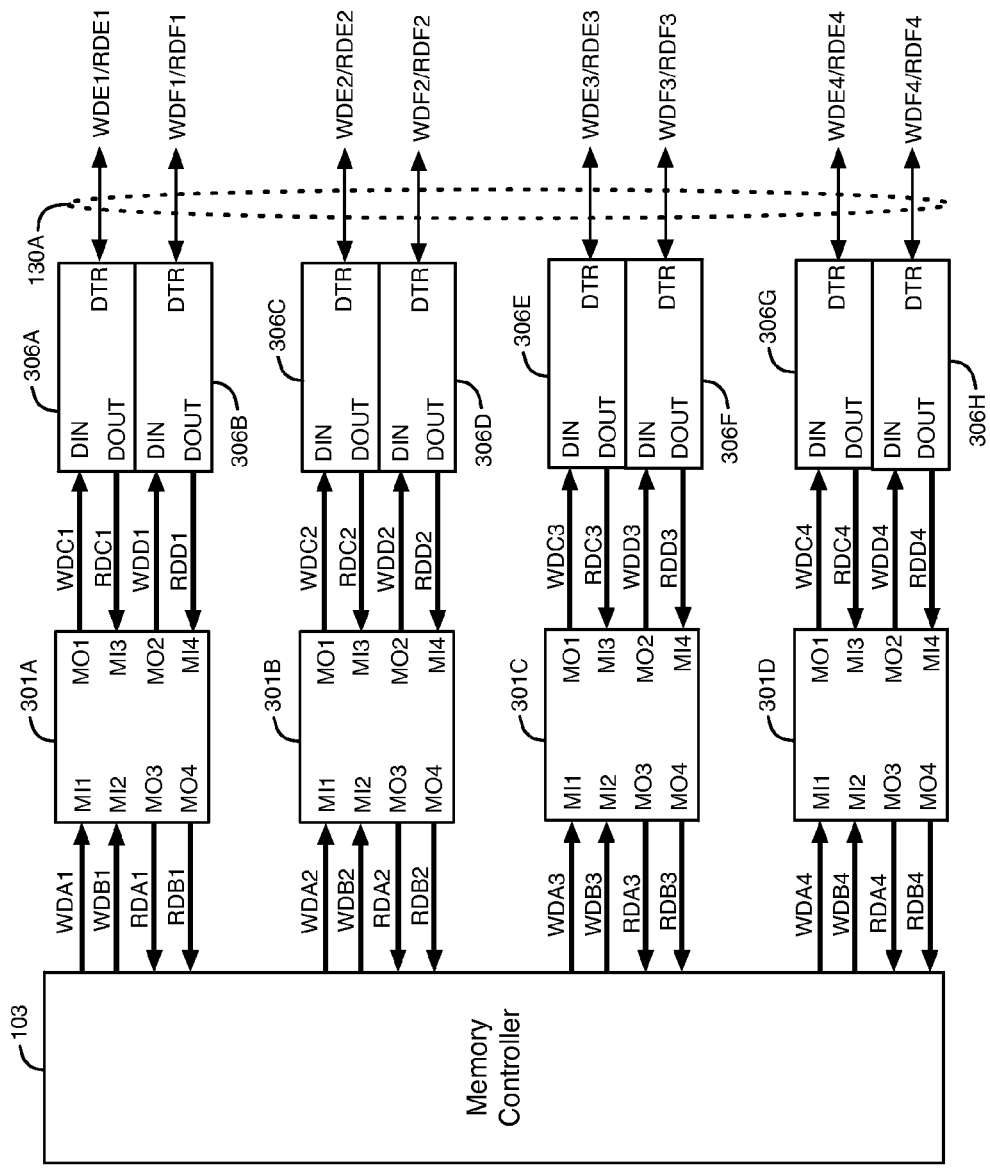
Figure 4B:
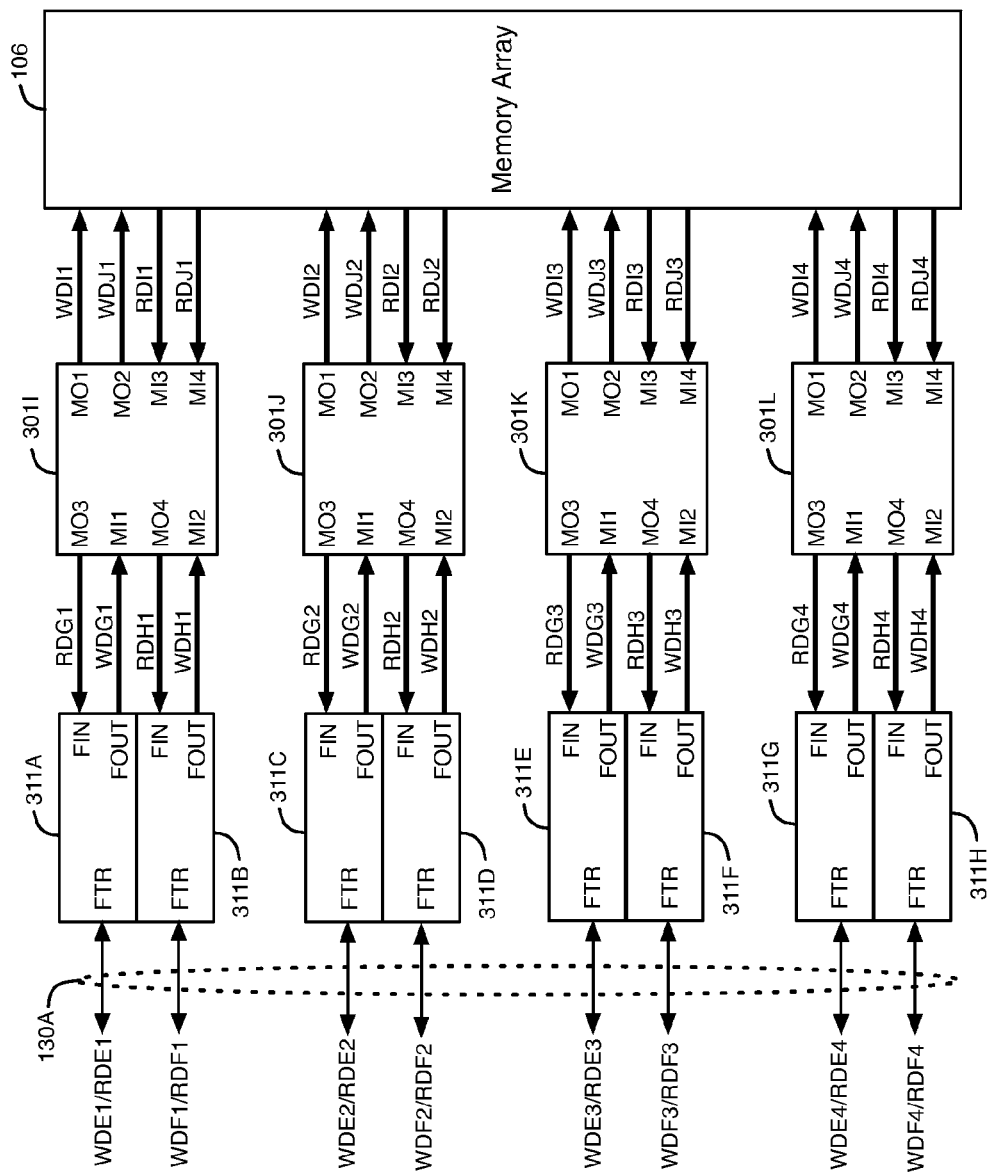
FIGS. 4B, 5B, and 6B illustrate additional details of circuits and signals in the memory integrated circuit.

FIG. 4A illustrates additional details of a portion of processor integrated circuit 101 including memory controller logic 103, steering circuits 301A-301D, and interface circuits 306A-306H. FIG. 4B illustrates additional details of a portion of memory integrated circuit 102 including memory array circuit 106, steering circuits 301I-301L, and interface circuits 311A-311H. FIGS. 4A-4B also illustrate signals that are associated with read and write requests to memory array circuit 106. The signals are provided through conductors shown as arrows in FIGS. 4A-4B. Details of write and read requests to memory array circuit 106 are described below with respect to FIGS. 4A-4B.

In the embodiments described herein, interface circuits 306A, 306C, 306E, and 306G are in the first subset interface circuits 112, interface circuits 311A, 311C, 311E, and 311G are in the first subset of interface circuits 122, interface circuits 306B, 306D, 306F, and 306H are in the second subset of interface circuits 112, and interface circuits 311B, 311D, 311F, and 311H are in the second subset of interface circuits 122 that are described above with respect to FIG. 2.

During operations 201, 203, and 205 in FIG. 2, signals associated with write requests and read requests to memory array circuit 106 are transmitted between interface circuits 306A-306H and interface circuits 311A-311H. During operation 202 in FIG. 2, signals associated with write requests and read requests to memory array circuit 106 are transmitted between interface circuits 306A, 306C, 306E, and 306G and interface circuits 311A, 311C, 311E, and 311G. Signals associated with write requests and read requests are not transmitted between interface circuits 306B, 306D, 306F, and 306H and interface circuits 311B, 311D, 311F, and 311H in operation 202, because operating parameters affecting signal transmission are changed in these interface circuits.

During operation 204 in FIG. 2, signals associated with write requests and read requests to memory array circuit 106 are transmitted between interface circuits 306B, 306D, 306F, and 306H and interface circuits 311B, 311D, 311F, and 311H. Signals associated with write requests and read requests are not transmitted between interface circuits 306A, 306C, 306E, and 306G and interface circuits 311A, 311C, 311E, and 311G in operation 204, because operating parameters affecting signal transmission are changed in these interface circuits.

The read data for read requests and the write data for write requests are transferred at reduced data rates in operations 202 and 204 relative to the data rates of the read and write data in operations 201, 203, and 205. In an embodiment, half of interface circuits 306A-306P and half of interface circuits 311A-311P do not transmit and receive read and write data in operations 202 and 204.

In response to memory controller logic 103 receiving a write request from processor circuit 104 to write data to memory array circuit 106, memory controller logic 103 generates 8 sets WDA1, WDB1, WDA2, WDB2, WDA3, WDB3, WDA4, and WDB4 of write data signals that indicate the write data, as shown in FIG. 4A. Each of the 8 sets WDA1, WDB1, WDA2, WDB2, WDA3, WDB3, WDA4, and WDB4 of write data signals is generated at a different set of output terminals of memory controller logic 103. Write data signals WDA1, WDA2, WDA3, and WDA4 are provided in parallel to the MI1 inputs of steering circuits 301A-301D, respectively. Write data signals WDB1, WDB2, WDB3, and WDB4 are provided in parallel to the MI2 inputs of steering circuits 301A-301D, respectively.

A description is now provided regarding the transfer of write data for write requests issued during operations 201, 203, and 205 from memory controller logic 103 to memory array circuit 106. If a write request occurs during one of operations 201, 203, or 205, steering circuits 301A, 301B, 301C, and 301D provide the write data indicated by write data signals WDA1, WDA2, WDA3, and WDA4 from their MI1 inputs to their MO1 outputs as write data signals WDC1, WDC2, WDC3, and WDC4, respectively. Write data signals WDC1, WDC2, WDC3, and WDC4 are provided in parallel to the DIN inputs of interface circuits 306A, 306C, 306E, and 306G, respectively. Steering circuits 301A, 301B, 301C, and 301D provide the write data indicated by write data signals WDB1, WDB2, WDB3, and WDB4 from their MI2 inputs to their MO2 outputs as write data signals WDD1, WDD2, WDD3, and WDD4, respectively. Write data signals WDD1, WDD2, WDD3, and WDD4 are provided in parallel to the DIN inputs of interface circuits 306B, 306D, 306F, and 306H, respectively.

Interface circuits 306A-306H include serializer circuits that convert the write data in write data signals WDC1, WDD1, WDC2, WDD2, WDC3, WDD3, WDC4, and WDD4 from parallel to serial write data at their DTR terminals in write data signals WDE1, WDF1, WDE2, WDF2, WDE3, WDF3, WDE4, and WDF4, respectively. Interface circuits 306A-306H transmit write data signals WDE1, WDF1, WDE2, WDF2, WDE3, WDF3, WDE4, and WDF4 from their DTR terminals to the FTR terminals of interface circuits 311A-311H, respectively, through conductors 130A, as shown in FIG. 4B. Conductors 130A are a subset of conductors 130.

Interface circuits 311A-311H include deserializer circuits that convert the write data in write data signals WDE1, WDF1, WDE2, WDF2, WDE3, WDF3, WDE4, and WDF4 from serial to parallel write data at their FOUT outputs in write data signals WDG1, WDH1, WDG2, WDH2, WDG3, WDH3, WDG4, and WDH4, respectively. Write data signals WDG1, WDG2, WDG3, and WDG4 are provided in parallel to the MI1 inputs of steering circuits 301I-301L, respectively. Write data signals WDH1, WDH2, WDH3, and WDH4 are provided in parallel to the MI2 inputs of steering circuits 301I-301L, respectively.

Steering circuits 301I, 301J, 301K, and 301L provide the write data indicated by write data signals WDG1, WDG2, WDG3, and WDG4 from their MI1 inputs to their MO1 outputs as write data signals WDI1, WDI2, WDI3, and WDI4, respectively. Steering circuits 301I, 301J, 301K, and 301L provide the write data indicated by write data signals WDH1, WDH2, WDH3, and WDH4 from their MI2 inputs to their MO2 outputs as write data signals WDJ1, WDJ2, WDJ3, and WDJ4, respectively. Each of the 8 sets of write data signals WDI1, WDI2, WDI3, WDI4, WDJ1, WDJ2, WDJ3, and WDJ4 is provided in parallel to a different set of input terminals of memory array circuit 106. In response to write requests received during any of operations 201-205, memory array circuit 106 stores the write data indicated by write data signals WDI1, WDI2, WDI3, WDI4, WDJ1, WDJ2, WDJ3, and WDJ4 at addresses provided from memory controller logic 103.

A description is now provided regarding the transfer of write data for write requests issued during operation 202 from memory controller logic 103 to memory array circuit 106. If a write request to memory array circuit 106 occurs during operation 202, steering circuits 301A, 301B, 301C, and 301D provide the write data indicated by write data signals WDA1, WDA2, WDA3, and WDA4 from their MI1 inputs to their MO1 outputs as write data signals WDC1, WDC2, WDC3, and WDC4, respectively, during a first time interval. Steering circuits 301A, 301B, 301C, and 301D provide the write data indicated by write data signals WDB1, WDB2, WDB3, and WDB4 from their MI2 inputs to their MO1 outputs as write data signals WDC1, WDC2, WDC3, and WDC4, respectively, during a second time interval after the first time interval.

Interface circuits 306A, 306C, 306E, and 306G provide the write data indicated by write data signals WDC1, WDC2, WDC3, and WDC4 in the first and second time intervals from their DIN inputs to their DTR terminals in serial as write data signals WDE1, WDE2, WDE3, and WDE4, respectively. Write data signals WDE1, WDE2, WDE3, and WDE4 are provided to the FTR terminals of interface circuits 311A, 311C, 311E, and 311G, respectively, through conductors 130A. Interface circuits 311A, 311C, 311E, and 311G provide the write data indicated by write data signals WDE1, WDE2, WDE3, and WDE4 from their FTR terminals to their FOUT outputs in parallel as write data signals WDG1, WDG2, WDG3, and WDG4, respectively. Write data signals WDG1, WDG2, WDG3, and WDG4 are provided in parallel to the MI1 inputs of steering circuits 301I, 301J, 301K, and 301L, respectively.

Steering circuits 301I, 301J, 301K, and 301L provide the write data indicated by write data signals WDG1, WDG2, WDG3, and WDG4 to their MO1 outputs as write data signals WDI1, WDI2, WDI3, and WDI4, respectively, during a third time interval. Write data signals WDI1, WDI2, WDI3, and WDI4 indicate the same write data as write data signals WDA1, WDA2, WDA3, and WDA4, respectively. Steering circuits 301I, 301J, 301K, and 301L provide the write data indicated by write data signals WDG1, WDG2, WDG3, and WDG4 to their MO2 outputs as write data signals WDJ1, WDJ2, WDJ3, and WDJ4, respectively, during a fourth time interval after the third time interval. Write data signals WDJ1, WDJ2, WDJ3, and WDJ4 indicate the same write data as write data signals WDB1, WDB2, WDB3, and WDB4, respectively.

A description is now provided regarding the transfer of write data for write requests issued during operation 204 from memory controller logic 103 to memory array circuit 106. If a write request to memory array circuit 106 occurs during operation 204, steering circuits 301A, 301B, 301C, and 301D provide the write data indicated by write data signals WDA1, WDA2, WDA3, and WDA4 from their MI1 inputs to their MO2 outputs as write data signals WDD1, WDD2, WDD3, and WDD4, respectively, during a first time interval. Steering circuits 301A, 301B, 301C, and 301D provide the write data indicated by write data signals WDB1, WDB2, WDB3, and WDB4 from their MI2 inputs to their MO2 outputs as write data signals WDD1, WDD2, WDD3, and WDD4, respectively, during a second time interval after the first time interval.

Interface circuits 306B, 306D, 306F, and 306H provide the write data indicated by write data signals WDD1, WDD2, WDD3, and WDD4 in the first and second time intervals from their DIN inputs to their DTR terminals in serial as write data signals WDF1, WDF2, WDF3, and WDF4, respectively. Write data signals WDF1, WDF2, WDF3, and WDF4 are transmitted to the FTR terminals of interface circuits 311B, 311D, 311F, and 311H, respectively, through conductors 130A. Interface circuits 311B, 311D, 311F, and 311H provide the write data indicated by write data signals WDF1, WDF2, WDF3, and WDF4 from their FTR terminals to their FOUT outputs in parallel as write data signals WDH1, WDH2, WDH3, and WDH4, respectively. Write data signals WDH1, WDH2, WDH3, and WDH4 are provided in parallel to the MI2 inputs of steering circuits 301I, 301J, 301K, and 301L, respectively.

Steering circuits 301I, 301J, 301K, and 301L provide the write data indicated by write data signals WDH1, WDH2, WDH3, and WDH4 to their MO1 outputs as write data signals WDI1, WDI2, WDI3, and WDI4, respectively, during a third time interval. Write data signals WDI1, WDI2, WDI3, and WDI4 indicate the same write data as write data signals WDA1, WDA2, WDA3, and WDA4, respectively. Steering circuits 301I, 301J, 301K, and 301L provide the write data indicated by write data signals WDH1, WDH2, WDH3, and WDH4 to their MO2 outputs as write data signals WDJ1, WDJ2, WDJ3, and WDJ4, respectively, during a fourth time interval after the third time interval. Write data signals WDJ1, WDJ2, WDJ3, and WDJ4 indicate the same write data as write data signals WDB1, WDB2, WDB3, and WDB4, respectively. Memory array circuit 106 stores the write data received for each write request in memory.

After receiving addresses generated in response to a read request, memory array circuit 106 retrieves read data from memory locations indicated by the addresses and provides the read data as 8 sets RDI1, RDJ1, RDI2, RDJ2, RDI3, RDJ3, RDI4, and RDJ4 of read data signals. Each of the 8 sets RDI1, RDJ1, RDI2, RDJ2, RDI3, RDJ3, RDI4, and RDJ4 of read data signals is generated at a different set of output terminals of memory array circuit 106. Read data signals RDI1, RDI2, RDI3, and RDI4 are provided in parallel to the MI3 inputs of steering circuits 301I-301L, respectively. Read data signals RDJ1, RDJ2, RDJ3, and RDJ4 are provided in parallel to the MI4 inputs of steering circuits 301I-301L, respectively.

A description is now provided regarding the transfer of read data for read requests issued during operations 201, 203, and 205 from memory array circuit 106 to memory controller logic 103. If a read request occurs during one of operations 201, 203, or 205, steering circuits 301I-301L provide the read data indicated by read data signals RDI1, RDI2, RDI3, and RDI4 from their MI3 inputs to their MO3 outputs as read data signals RDG1, RDG2, RDG3, and RDG4, respectively. Steering circuits 301I-301L also provide the read data indicated by read data signals RDJ1, RDJ2, RDJ3, and RDJ4 from their MI4 inputs to their MO4 outputs as read data signals RDH1, RDH2, RDH3, and RDH4, respectively. Read data signals RDG1, RDG2, RDG3, and RDG4 are provided in parallel to the FIN inputs of interface circuits 311A, 311C, 311E, and 311G, respectively. Read data signals RDH1, RDH2, RDH3, and RDH4 are provided in parallel to the FIN inputs of interface circuits 311B, 311D, 311F, and 311H, respectively.

Interface circuits 311A-311H include serializer circuits that convert the read data indicated by read data signals RDG1, RDH1, RDG2, RDH2, RDG3, RDH3, RDG4, and RDH4 into serial read data at their FTR terminals in read data signals RDE1, RDF1, RDE2, RDF2, RDE3, RDF3, RDE4, and RDF4, respectively. Read data signals RDE1, RDF1, RDE2, RDF2, RDE3, RDF3, RDE4, and RDF4 are provided through conductors 130A to the DTR terminals of interface circuits 306A-306H, respectively. Interface circuits 306A-306H include deserializer circuits that convert the serial read data indicated by read data signals RDE1, RDF1, RDE2, RDF2, RDE3, RDF3, RDE4, and RDF4 into parallel read data at their DOUT outputs in read data signals RDC1, RDD1, RDC2, RDD2, RDC3, RDD3, RDC4, and RDD4, respectively.

Read data signals RDC1, RDC2, RDC3, and RDC4 are provided in parallel to the MI3 inputs of steering circuits 301A-301D, respectively. Read data signals RDD1, RDD2, RDD3, and RDD4 are provided in parallel to the MI4 inputs of steering circuits 301A-301D, respectively. Steering circuits 301A-301D provide the read data in read data signals RDC1, RDC2, RDC3, and RDC4 from their MI3 inputs to their MO3 outputs as read data signals RDA1, RDA2, RDA3, and RDA4, respectively. Steering circuits 301A-301D provide the read data in read data signals RDD1, RDD2, RDD3, and RDD4 from their MI4 inputs to their MO4 outputs as read data signals RDB1, RDB2, RDB3, and RDB4, respectively. Read data signals RDA1, RDA2, RDA3, RDA4, RDB1, RDB2, RDB3, and RDB4 are provided in parallel to memory controller logic 103. Each of the 8 sets RDA1, RDA2, RDA3, RDA4, RDB1, RDB2, RDB3, and RDB4 of read data signals is provided in parallel to a different set of input terminals of memory controller logic 103. Memory controller logic 103 provides the read data indicated by read data signals RDA1, RDA2, RDA3, RDA4, RDB1, RDB2, RDB3, and RDB4 to processor circuit 104 in response to a read request.

A description is now provided regarding the transfer of read data for read requests issued during operation 202 from memory array circuit 106 to memory controller logic 103. If a read request to memory array circuit 106 is issued during operation 202, steering circuits 301I-301L provide the read data indicated by read data signals RDI1, RDI2, RDI3, and RDI4 from their MI3 inputs to their MO3 outputs as read data signals RDG1, RDG2, RDG3, and RDG4, respectively, during a first time interval. Steering circuits 301I-301L provide the read data indicated by read data signals RDJ1, RDJ2, RDJ3, and RDJ4 from their MI4 inputs to their MO3 outputs as read data signals RDG1, RDG2, RDG3, and RDG4, respectively, during a second time interval after the first time interval.

Interface circuits 311A, 311C, 311E, and 311G convert the read data indicated by read data signals RDG1, RDG2, RDG3, and RDG4 in the first and second time intervals into serial read data at their FTR terminals in read data signals RDE1, RDE2, RDE3, and RDE4, respectively. Read data signals RDE1, RDE2, RDE3, and RDE4 are transmitted through conductors 130A to the DTR terminals of interface circuits 306A, 306C, 306E, and 306G, respectively. Interface circuits 306A, 306C, 306E, and 306G convert the serial read data indicated by read data signals RDE1, RDE2, RDE3, and RDE4 into parallel read data at their DOUT outputs in read data signals RDC1, RDC2, RDC3, and RDC4, respectively.

Read data signals RDC1, RDC2, RDC3, and RDC4 are provided in parallel to the MI3 inputs of steering circuits 301A-301D, respectively. Steering circuits 301A-301D provide the read data in read data signals RDC1, RDC2, RDC3, and RDC4 from their MI3 inputs to their MO3 outputs as read data signals RDA1, RDA2, RDA3, and RDA4, respectively, in a third time interval. The read data signals RDA1, RDA2, RDA3, and RDA4 indicate the same read data as read data signals RDI1, RDI2, RDI3, and RDI4, respectively. Steering circuits 301A-301D provide the read data in read data signals RDC1, RDC2, RDC3, and RDC4 from their MI3 inputs to their MO4 outputs as read data signals RDB1, RDB2, RDB3, and RDB4, respectively, in a fourth time interval after the third time interval. The read data signals RDB1, RDB2, RDB3, and RDB4 indicate the same read data as read data signals RDJ1, RDJ2, RDJ3, and RDJ4, respectively.

A description is now provided regarding the transfer of read data for read requests issued during operation 204 from memory array circuit 106 to memory controller logic 103. If a read request to memory array circuit 106 is issued during operation 204, steering circuits 301I-301L provide the read data indicated by read data signals RDI1, RDI2, RDI3, and RDI4 from their MI3 inputs to their MO4 outputs as read data signals RDH1, RDH2, RDH3, and RDH4, respectively, during a first time interval. Steering circuits 301I-301L provide the read data indicated by read data signals RDJ1, RDJ2, RDJ3, and RDJ4 from their MI4 inputs to their MO4 outputs as read data signals RDH1, RDH2, RDH3, and RDH4, respectively, during a second time interval after the first time interval.

Interface circuits 311B, 311D, 311F, and 311H convert the read data indicated by read data signals RDH1, RDH2, RDH3, and RDH4 in the first and second time intervals into serial read data at their FTR terminals in read data signals RDF1, RDF2, RDF3, and RDF4, respectively. Read data signals RDF1, RDF2, RDF3, and RDF4 are transmitted through conductors 130A to the DTR terminals of interface circuits 306B, 306D, 306F, and 306H, respectively. Interface circuits 306B, 306D, 306F, and 306H convert the serial read data indicated by read data signals RDFT, RDF2, RDF3, and RDF4 into parallel read data at their DOUT outputs in read data signals RDD1, RDD2, RDD3, and RDD4, respectively.

Read data signals RDD1, RDD2, RDD3, and RDD4 are provided in parallel to the MI4 inputs of steering circuits 301A-301D, respectively. Steering circuits 301A-301D provide the read data in read data signals RDD1, RDD2, RDD3, and RDD4 from their MI4 inputs to their MO3 outputs as read data signals RDA1, RDA2, RDA3, and RDA4, respectively, in a third time interval. The read data signals RDA1, RDA2, RDA3, and RDA4 indicate the same read data as read data signals RDI1, RDI2, RDI3, and RDI4, respectively. Steering circuits 301A-301D provide the read data in read data signals RDD1, RDD2, RDD3, and RDD4 from their MI4 inputs to their MO4 outputs as read data signals RDB1, RDB2, RDB3, and RDB4, respectively, in a fourth time interval after the third time interval. The read data signals RDB1, RDB2, RDB3, and RDB4 indicate the same read data as read data signals RDJ1, RDJ2, RDJ3, and RDJ4, respectively. The read data is provided to processor circuit 104 in response to a read request.

Figure 5A:
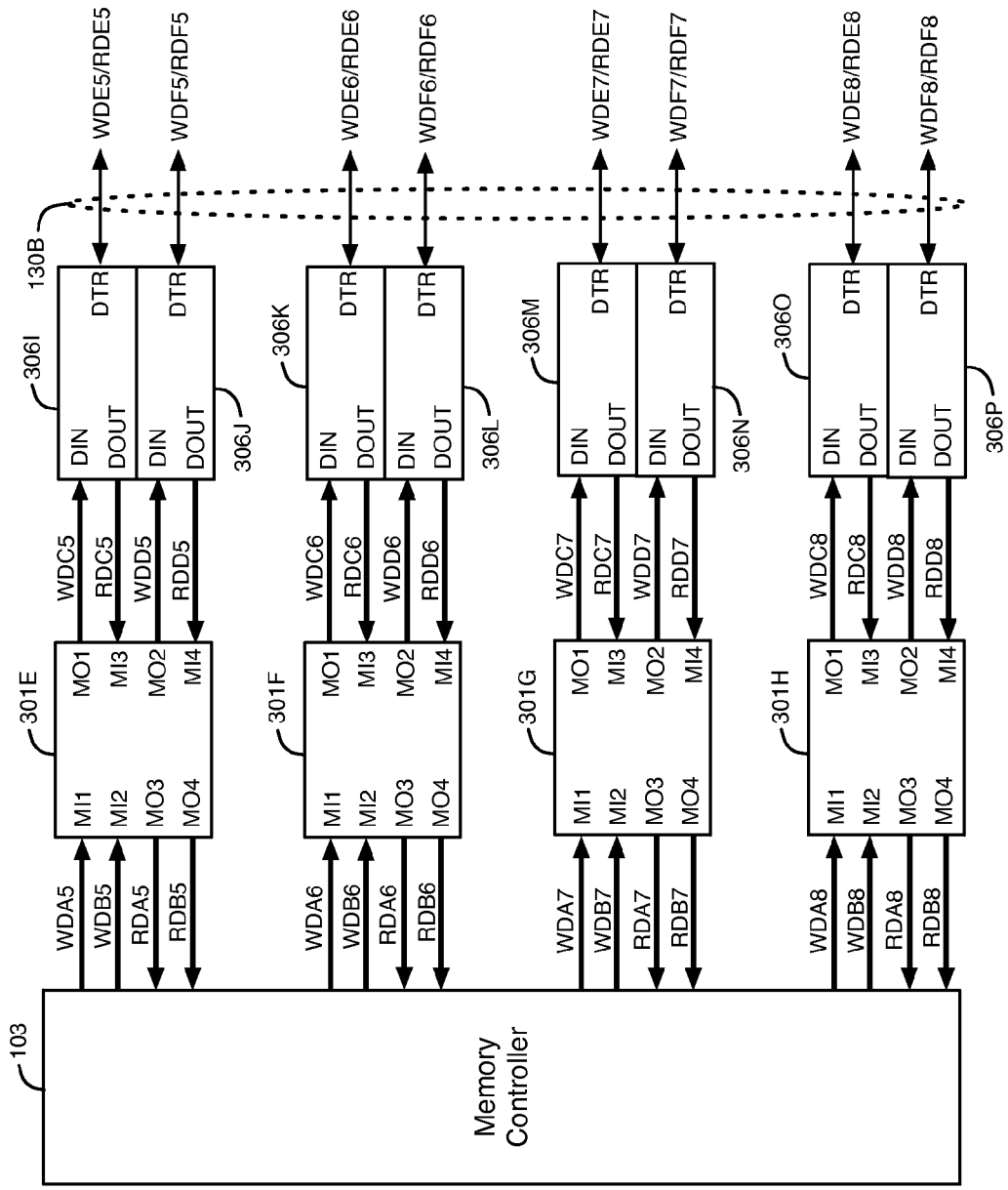
Figure 5B:
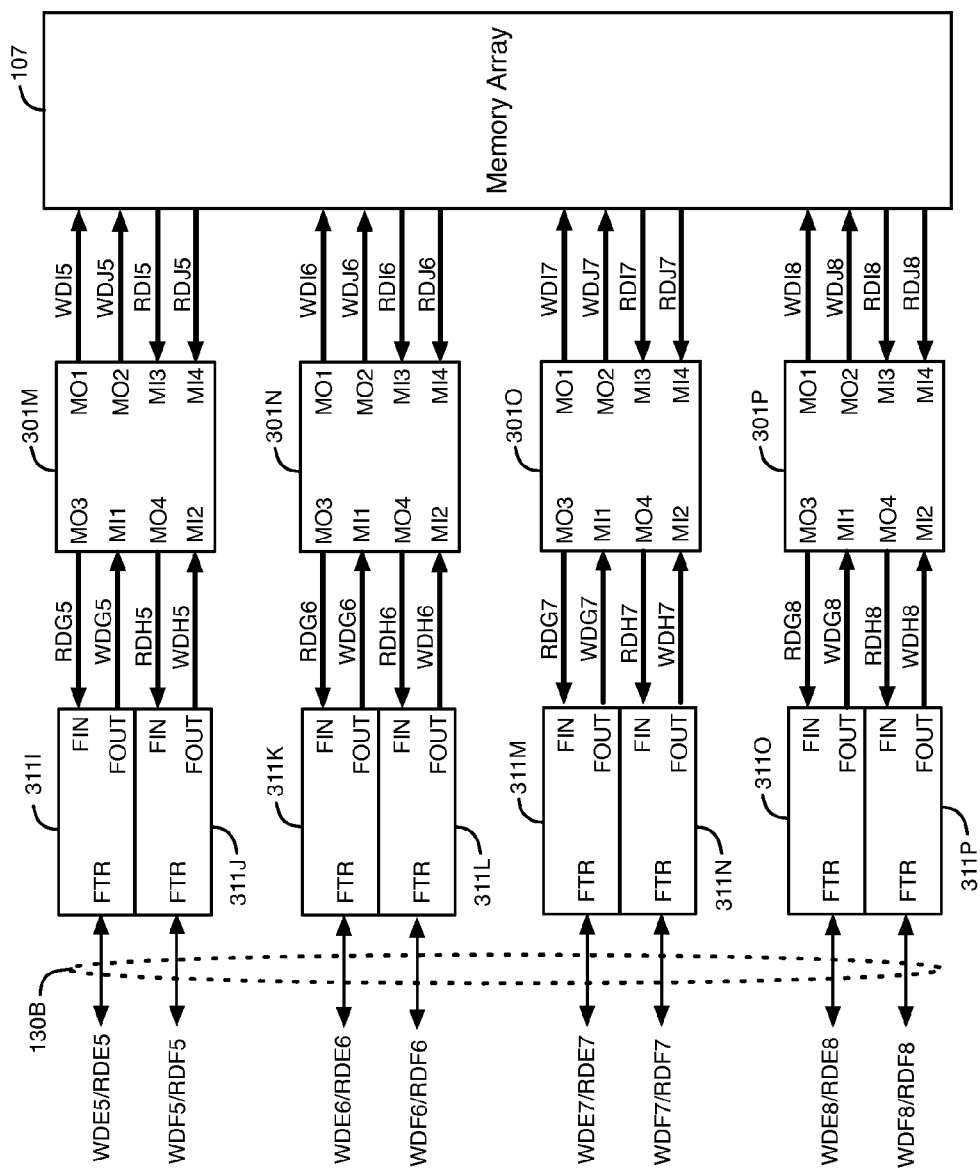

FIG. 5A illustrates memory controller logic 103, steering circuits 301E-301H, and interface circuits 306I-306P. FIG. 5B illustrates memory array circuit 107, steering circuits 301M-301P, and interface circuits 311I-311P. FIGS. 5A-5B also illustrate signals that are associated with read and write requests to memory array circuit 107. The signals are provided through conductors shown as arrows in FIGS. 5A-5B. Details of write and read requests to memory array circuit 107 are described below with respect to FIGS. 5A-5B.

In the embodiments described herein, interface circuits 306I, 306K, 306M, and 306O are in the first subset interface circuits 112, interface circuits 311I, 311K, 311M, and 311O are in the first subset of interface circuits 122, interface circuits 306J, 306L, 306N, and 306P are in the second subset of interface circuits 112, and interface circuits 311J, 311L, 311N, and 311P are in the second subset of interface circuits 122 that are described above with respect to FIG. 2.

During operations 201, 203, and 205 in FIG. 2, signals associated with write and read requests to memory array circuit 107 are transmitted between interface circuits 306I-306P and interface circuits 311I-311P. During operation 202 in FIG. 2, signals associated with write and read requests to memory array circuit 107 are transmitted between interface circuits 306I, 306K, 306M, and 306O and interface circuits 311I, 311K, 311M, and 311O. Signals associated with write requests and read requests are not transmitted between interface circuits 306J, 306L, 306N, and 306P and interface circuits 311J, 311L, 311N, and 311P in operation 202, because operating parameters affecting signal transmission are changed in these interface circuits.

During operation 204 in FIG. 2, signals associated with write and read requests to memory array circuit 107 are transmitted between interface circuits 306J, 306L, 306N, and 306P and interface circuits 311J, 311L, 311N, and 311P. Signals associated with write and read requests are not transmitted between interface circuits 306I, 306K, 306M, and 306O and interface circuits 311I, 311K, 311M, and 311O in operation 204, because operating parameters affecting signal transmission are changed in these interface circuits.

In response to memory controller logic 103 receiving a write request from processor circuit 104 to write data to memory array circuit 107, memory controller logic 103 generates 8 sets WDA5, WDB5, WDA6, WDB6, WDA7, WDB7, WDA8, and WDB8 of write data signals that indicate the write data, as shown in FIG. 5A. Each of the 8 sets WDA5, WDB5, WDA6, WDB6, WDA7, WDB7, WDA8, and WDB8 of write data signals is generated at a different set of output terminals of memory controller logic 103. Write data signals WDA5, WDA6, WDA7, and WDA8 are provided in parallel to the MI1 inputs of steering circuits 301E-301H, respectively. Write data signals WDB5, WDB6, WDB7, and WDB8 are provided in parallel to the MI2 inputs of steering circuits 301E-301H, respectively.

A description is now provided regarding how write data for write requests issued during operations 201, 203, and 205 are transferred from memory controller logic 103 to memory array circuit 107. If a write request is issued during one of operations 201, 203, or 205, steering circuits 301E-301H provide the write data indicated by write data signals WDA5, WDA6, WDA7, and WDA8 from their MI1 inputs to their MO1 outputs as write data signals WDC5, WDC6, WDC7, and WDC8, respectively. Write data signals WDC5, WDC6, WDC7, and WDC8 are provided in parallel to the DIN inputs of interface circuits 306I, 306K, 306M, and 306O, respectively. Steering circuits 301E-301H provide the write data indicated by write data signals WDB5, WDB6, WDB7, and WDB8 from their MI2 inputs to their MO2 outputs as write data signals WDD5, WDD6, WDD7, and WDD8, respectively. Write data signals WDD5, WDD6, WDD7, and WDD8 are provided in parallel to the DIN inputs of interface circuits 306J, 306L, 306N, and 306P, respectively.

Interface circuits 306I-306P include serializer circuits that convert the write data in write data signals WDC5, WDD5, WDC6, WDD6, WDC7, WDD7, WDC8, and WDD8 from parallel to serial write data at their DTR terminals in write data signals WDE5, WDF5, WDE6, WDF6, WDE7, WDF7, WDE8, and WDF8, respectively. Interface circuits 306I-306P transmit write data signals WDE5, WDF5, WDE6, WDF6, WDE7, WDF7, WDE8, and WDF8 from their DTR terminals to the FTR terminals of interface circuits 311I-311P, respectively, through conductors 130B as shown in FIG. 5B. Conductors 130B are a subset of conductors 130.

Interface circuits 311I-311P include deserializer circuits that convert the write data in write data signals WDE5, WDF5, WDE6, WDF6, WDE7, WDF7, WDE8, and WDF8 from serial to parallel write data at their FOUT outputs in write data signals WDG5, WDH5, WDG6, WDH6, WDG7, WDH7, WDG8, and WDH8, respectively. Write data signals WDG5, WDG6, WDG7, and WDG8 are provided in parallel to the MI1 inputs of steering circuits 301M-301P, respectively. Write data signals WDH5, WDH6, WDH7, and WDH8 are provided in parallel to the MI2 inputs of steering circuits 301M-301P, respectively.

Steering circuits 301M-301P provide the write data indicated by write data signals WDG5, WDG6, WDG7, and WDG8 from their MI1 inputs to their MO1 outputs as write data signals WDI5, WDI6, WDI7, and WDI8, respectively. Steering circuits 301M-301P provide the write data indicated by write data signals WDH5, WDH6, WDH7, and WDH8 from their MI2 inputs to their MO2 outputs as write data signals WDJ5, WDJ6, WDJ7, and WDJ8, respectively. Write data signals WDI5, WDI6, WDI7, WDI8, WDJ5, WDJ6, WDJ7, and WDJ8 are provided in parallel to inputs of memory array circuit 107. Each of the 8 sets WDI5, WDI6, WDI7, WDI8, WDJ5, WDJ6, WDJ7, and WDJ8 of write data signals is provided in parallel to a different set of input terminals of memory array circuit 107. In response to write requests received during any of operations 201-205, memory array circuit 107 stores the write data indicated by write data signals WDI5, WDI6, WDI7, WDI8, WDJ5, WDJ6, WDJ7, and WDJ8 at memory locations indicated by addresses received from memory controller logic 103.

A description is now provided regarding how write data for write requests issued during operation 202 are transferred from memory controller logic 103 to memory array circuit 107. If a write request to memory array circuit 107 is issued during operation 202, steering circuits 301E-301H provide the write data indicated by write data signals WDA5, WDA6, WDA7, and WDA8 from their MI1 inputs to their MO1 outputs as write data signals WDC5, WDC5, WDC7, and WDC8, respectively, during a first time interval. Steering circuits 301E-301H provide the write data indicated by write data signals WDB5, WDB6, WDB7, and WDB8 from their MI2 inputs to their MO1 outputs as write data signals WDC5, WDC6, WDC7, and WDC8, respectively, during a second time interval after the first time interval.

Interface circuits 306I, 306K, 306M, and 306O provide the write data indicated by write data signals WDC5, WDC6, WDC7, and WDC8 in the first and second time intervals from their DIN inputs to their DTR terminals in serial as write data signals WDE5, WDE6, WDE7, and WDE8, respectively. Write data signals WDE5, WDE6, WDE7, and WDE8 are transmitted to the FTR terminals of interface circuits 311I, 311K, 311M, and 311O, respectively, through conductors 130B. Interface circuits 311I, 311K, 311M, and 311O provide the write data indicated by write data signals WDE5, WDE6, WDE7, and WDE8 from their FTR terminals to their FOUT outputs in parallel as write data signals WDG5, WDG6, WDG7, and WDG8, respectively. Write data signals WDG5, WDG6, WDG7, and WDG8 are provided in parallel to the MI1 inputs of steering circuits 301M-301P, respectively.

Steering circuits 301M-301P provide the write data indicated by write data signals WDG5, WDG6, WDG7, and WDG8 to their MO1 outputs as write data signals WDI5, WDI6, WDI7, and WDI8, respectively, during a third time interval. Write data signals WDI5, WDI6, WDI7, and WDI8 indicate the same write data as write data signals WDA5, WDA6, WDA7, and WDA8, respectively. Steering circuits 301M-301P provide the write data indicated by write data signals WDG5, WDG6, WDG7, and WDG8 to their MO2 outputs as write data signals WDJ5, WDJ6, WDJ7, and WDJ8, respectively, during a fourth time interval after the third time interval. Write data signals WDJ5, WDJ6, WDJ7, and WDJ8 indicate the same write data as write data signals WDB5, WDB6, WDB7, and WDB8, respectively.

A description is now provided regarding how write data for write requests issued during operation 204 are transferred from memory controller logic 103 to memory array circuit 107. If a write request to memory array circuit 107 is issued during operation 204, steering circuits 301E-301H provide the write data indicated by write data signals WDA5, WDA6, WDA7, and WDA8 from their MI1 inputs to their MO2 outputs as write data signals WDD5, WDD6, WDD7, and WDD8, respectively, during a first time interval. Steering circuits 301E-301H provide the write data indicated by write data signals WDB5, WDB6, WDB7, and WDB8 from their MI2 inputs to their MO2 outputs as write data signals WDD5, WDD6, WDD7, and WDD8, respectively, during a second time interval after the first time interval.

Interface circuits 306J, 306L, 306N, and 306P provide the write data indicated by write data signals WDD5, WDD6, WDD7, and WDD8 in the first and second time intervals from their DIN inputs to their DTR terminals in serial as write data signals WDF5, WDF6, WDF7, and WDF8, respectively. Write data signals WDF5, WDF6, WDF7, and WDF8 are transmitted to the FTR terminals of interface circuits 311J, 311L, 311N, and 311P, respectively, through conductors 130B. Interface circuits 311J, 311L, 311N, and 311P provide the write data indicated by write data signals WDF5, WDF6, WDF7, and WDF8 from their FTR terminals to their FOUT outputs in parallel as write data signals WDH5, WDH6, WDH7, and WDH8, respectively. Write data signals WDH5, WDH6, WDH7, and WDH8 are provided in parallel to the MI2 inputs of steering circuits 301M, 301N, 301O, and 301P, respectively.

Steering circuits 301M-301P provide the write data indicated by write data signals WDH5, WDH6, WDH7, and WDH8 to their MO1 outputs as write data signals WDI5, WDI6, WDI7, and WDI8, respectively, during a third time interval. Write data signals WDI5, WDI6, WDI7, and WDI8 indicate the same write data as write data signals WDA5, WDA6, WDA7, and WDA8, respectively. Steering circuits 301M-301P provide the write data indicated by write data signals WDH5, WDH6, WDH7, and WDH8 to their MO2 outputs as write data signals WDJ5, WDJ6, WDJ7, and WDJ8, respectively, during a fourth time interval after the third time interval. Write data signals WDJ5, WDJ6, WDJ7, and WDJ8 indicate the same write data as write data signals WDB5, WDB6, WDB7, and WDB8, respectively. The write data for each write request issued in each of operations 201-205 is provided to memory array circuit 107.

After receiving addresses generated in response to a read request, memory array circuit 107 retrieves read data from memory locations indicated by the addresses and provides the read data as read data signals RDI5, RDJ5, RDI6, RDJ6, RDI7, RDJ7, RDI8, and RDJ8. Each of the 8 sets RDI5, RDJ5, RDI6, RDJ6, RDI7, RDJ7, RDI8, and RDJ8 of read data signals is generated at a different set of output terminals of memory array circuit 107. Read data signals RDI5, RDI6, RDI7, and RDI8 are provided in parallel to the MI3 inputs of steering circuits 301M-301P, respectively. Read data signals RDJ5, RDJ6, RDJ7, and RDJ8 are provided in parallel to the MI4 inputs of steering circuits 301M-301P, respectively.

A description is now provided regarding how read data for read requests issued during operations 201, 203, and 205 are transferred from memory array circuit 107 to memory controller logic 103. If a read request to memory array circuit 107 is issued during one of operations 201, 203, or 205, steering circuits 301M-301P provide the read data indicated by read data signals RDI5, RDI6, RDI7, and RDI8 from their MI3 inputs to their MO3 outputs as read data signals RDG5, RDG6, RDG7, and RDG8, respectively. Steering circuits 301M-301P also provide the read data indicated by read data signals RDJ5, RDJ6, RDJ7, and RDJ8 from their MI4 inputs to their MO4 outputs as read data signals RDH5, RDH6, RDH7, and RDH8, respectively. Read data signals RDG5, RDG6, RDG7, and RDG8 are provided in parallel to the FIN inputs of interface circuits 311I, 311K, 311M, and 311O, respectively. Read data signals RDH5, RDH6, RDH7, and RDH8 are provided in parallel to the FIN inputs of interface circuits 311J, 311L, 311N, and 311P, respectively.

Interface circuits 311I-311P include serializer circuits that convert the read data indicated by read data signals RDG5, RDH5, RDG6, RDH6, RDG7, RDH7, RDG8, and RDH8 into serial read data at their FTR terminals in read data signals RDE5, RDF5, RDE6, RDF6, RDE7, RDF7, RDE8, and RDF8, respectively. Read data signals RDE5, RDF5, RDE6, RDF6, RDE7, RDF7, RDE8, and RDF8 are provided through conductors 130B to the DTR terminals of interface circuits 306I-306P, respectively. Interface circuits 306I-306P include deserializer circuits that convert the serial read data indicated by read data signals RDE5, RDF5, RDE6, RDF6, RDE7, RDF7, RDE8, and RDF8 into parallel read data at their DOUT outputs in read data signals RDC5, RDD5, RDC6, RDD6, RDC7, RDD7, RDC8, and RDD8, respectively.

Read data signals RDC5, RDC6, RDC7, and RDC8 are provided in parallel to the MI3 inputs of steering circuits 301E-301H, respectively. Read data signals RDD5, RDD6, RDD7, and RDD8 are provided in parallel to the MI4 inputs of steering circuits 301E-301H, respectively. Steering circuits 301E-301H provide the read data in read data signals RDC5, RDC6, RDC7, and RDC8 from their MI3 inputs to their MO3 outputs as read data signals RDA5, RDA6, RDA7, and RDA8, respectively. Steering circuits 301E-301H provide the read data in read data signals RDD5, RDD6, RDD7, and RDD8 from their MI4 inputs to their MO4 outputs as read data signals RDB5, RDB6, RDB7, and RDB8, respectively. Read data signals RDA5, RDA6, RDA7, RDA8, RDB5, RDB6, RDB7, and RDB8 are provided in parallel to memory controller logic 103. Each of the 8 sets RDA5, RDA6, RDA7, RDA8, RDB5, RDB6, RDB7, and RDB8 of read data signals is provided to a different set of input terminals of memory controller logic 103. Memory controller logic 103 provides the read data indicated by read data signals RDA5, RDA6, RDA7, RDA8, RDB5, RDB6, RDB7, and RDB8 to processor circuit 104 in response to a read request issued during any of operations 201-205.

A description is now provided regarding how read data for read requests issued during operation 202 are transferred from memory array circuit 107 to memory controller logic 103. If a read request to memory array circuit 107 is issued during operation 202, steering circuits 301M-301P provide the read data indicated by read data signals RDI5, RDI6, RDI7, and RDI8 from their MI3 inputs to their MO3 outputs as read data signals RDG5, RDG6, RDG7, and RDG8, respectively, during a first time interval. Steering circuits 301M-301P provide the read data indicated by read data signals RDJ5, RDJ6, RDJ7, and RDJ8 from their MI4 inputs to their MO3 outputs as read data signals RDG5, RDG6, RDG7, and RDG8, respectively, during a second time interval after the first time interval.

Interface circuits 311I, 311K, 311M, and 311O convert the read data indicated by read data signals RDG5, RDG6, RDG7, and RDG8 in the first and second time intervals into serial read data at their FTR terminals in read data signals RDE5, RDE6, RDE7, and RDE8, respectively. Read data signals RDE5, RDE6, RDE7, and RDE8 are transmitted through conductors 130B to the DTR terminals of interface circuits 306I, 306K, 306M, and 306O, respectively. Interface circuits 306I, 306K, 306M, and 306O convert the serial read data indicated by read data signals RDE5, RDE6, RDE7, and RDE8 into parallel read data at their DOUT outputs in read data signals RDC5, RDC6, RDC7, and RDC8, respectively.

Read data signals RDC5, RDC6, RDC7, and RDC8 are provided in parallel to the MI3 inputs of steering circuits 301E-301H, respectively. Steering circuits 301E-301H provide the read data in read data signals RDC5, RDC6, RDC7, and RDC8 from their MI3 inputs to their MO3 outputs as read data signals RDA5, RDA6, RDA7, and RDA8, respectively, in a third time interval. The read data signals RDA5, RDA6, RDA7, and RDA8 indicate the same read data as read data signals RDI5, RDI6, RDI7, and RDI8, respectively. Steering circuits 301E-301H provide the read data in read data signals RDC5, RDC6, RDC7, and RDC8 from their MI3 inputs to their MO4 outputs as read data signals RDB5, RDB6, RDB7, and RDB8, respectively, in a fourth time interval after the third time interval. The read data signals RDB5, RDB6, RDB7, and RDB8 indicate the same read data as read data signals RDJ5, RDJ6, RDJ7, and RDJ8, respectively.

A description is now provided regarding how read data for read requests issued during operation 204 are transferred from memory array circuit 107 to memory controller logic 103. If a read request to memory array circuit 107 is issued during operation 204, steering circuits 301M-301P provide the read data indicated by read data signals RDI5, RDI6, RDI7, and RDI8 from their MI3 inputs to their MO4 outputs as read data signals RDH5, RDH6, RDH7, and RDH8, respectively, during a first time interval. Steering circuits 301M-301P provide the read data indicated by read data signals RDJ5, RDJ6, RDJ7, and RDJ8 from their MI4 inputs to their MO4 outputs as read data signals RDH5, RDH6, RDH7, and RDH8, respectively, during a second time interval after the first time interval.

Interface circuits 311J, 311L, 311N, and 311P convert the read data indicated by read data signals RDH5, RDH6, RDH7, and RDH8 in the first and second time intervals into serial read data at their FTR terminals in read data signals RDF5, RDF6, RDF7, and RDF8, respectively. Read data signals RDF5, RDF6, RDF7, and RDF8 are transmitted through conductors 130B to the DTR terminals of interface circuits 306J, 306L, 306N, and 306P, respectively. Interface circuits 306J, 306L, 306N, and 306P convert the serial read data indicated by read data signals RDF5, RDF6, RDF7, and RDF8 into parallel read data at their DOUT outputs in read data signals RDD5, RDD6, RDD7, and RDD8, respectively.

Read data signals RDD5, RDD6, RDD7, and RDD8 are provided in parallel to the MI4 inputs of steering circuits 301E-301H, respectively. Steering circuits 301E-301H provide the read data in read data signals RDD5, RDD6, RDD7, and RDD8 from their MI4 inputs to their MO3 outputs as read data signals RDA5, RDA6, RDA7, and RDA8, respectively, in a third time interval. The read data signals RDA5, RDA6, RDA7, and RDA8 indicate the same read data as read data signals RDI5, RDI6, RDI7, and RDI8, respectively. Steering circuits 301E-301H provide the read data in read data signals RDD5, RDD6, RDD7, and RDD8 from their MI4 inputs to their MO4 outputs as read data signals RDB5, RDB6, RDB7, and RDB8, respectively, in a fourth time interval after the third time interval. The read data signals RDB5, RDB6, RDB7, and RDB8 indicate the same read data as read data signals RDJ5, RDJ6, RDJ7, and RDJ8, respectively. The read data for each read request is provided to memory controller logic 103.

Figure 6B:
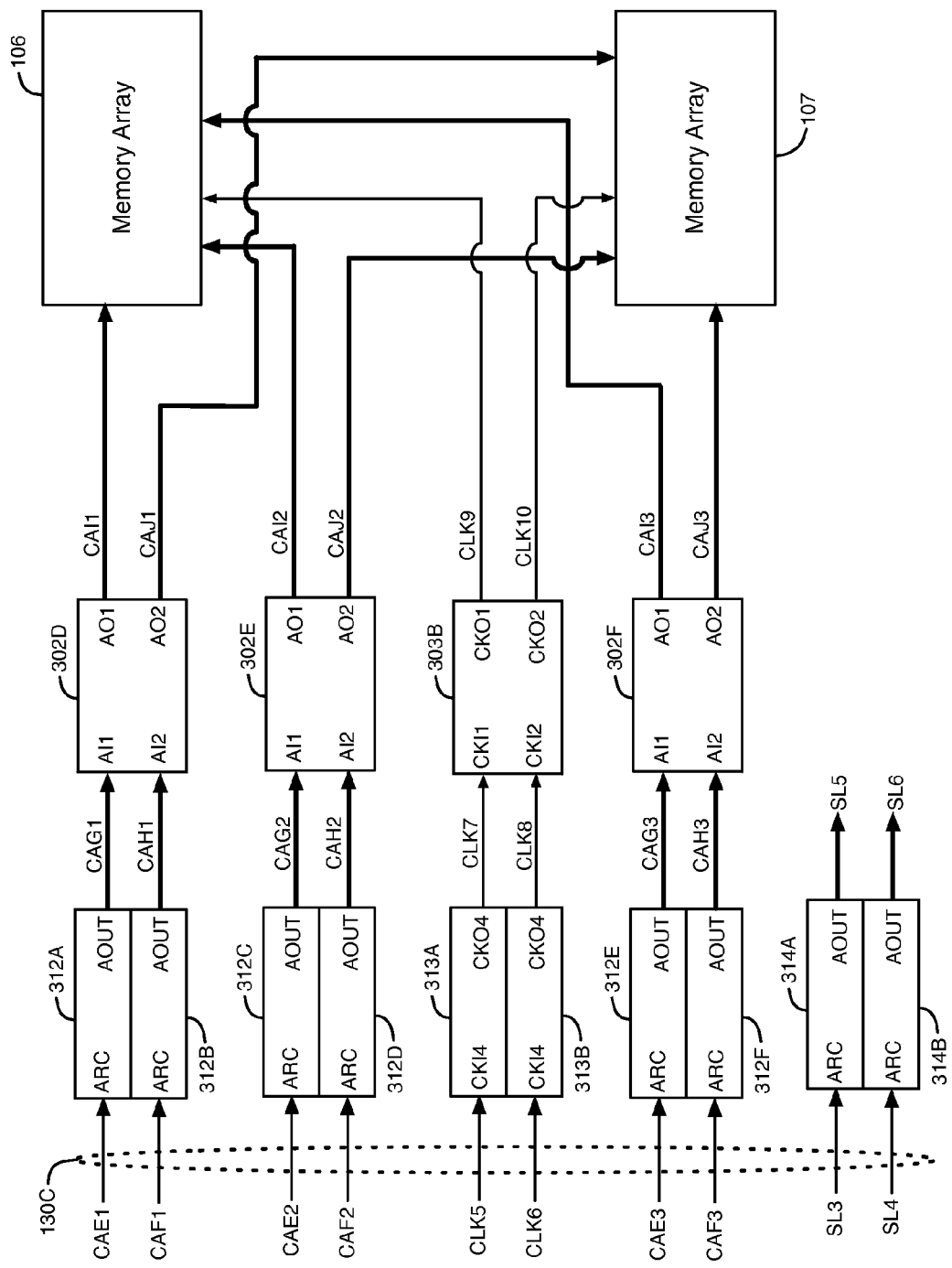

FIG. 6A illustrates memory controller logic 103, steering circuits 302A-302C, steering circuit 303A, interface circuits 307A-307F, interface circuits 308A-308B, and interface circuits 309A-309B. FIG. 6B illustrates memory array circuits 106-107, steering circuits 302D-302F, steering circuit 303B, interface circuits 312A-312F, interface circuits 313A-313B, and interface circuits 314A-314B. FIGS. 6A-6B also illustrate address signals, clock signals, and control signals that are used for read and write requests to memory array circuits 106-107. The signals are provided through conductors shown as arrows in FIGS. 6A-6B.

In the embodiment of FIGS. 6A-6B, interface circuits 307A, 307C, 308A, and 307E are in the first subset interface circuits 112, interface circuits 307B, 307D, 308B, and 307F are in the second subset of interface circuits 112, interface circuits 312A, 312C, 313A, and 312E are in the first subset of interface circuits 122, and interface circuits 312B, 312D, 313B, and 312F are in the second subset of interface circuits 122 that are described above with respect to FIG. 2.

During operations 201, 203, and 205, signals associated with write and read requests to memory array circuits 106-107 are transmitted from interface circuits 307A-307F and 308A-308B to interface circuits 312A-312F and 313A-313B, respectively. During operation 202, signals associated with write and read requests to memory array circuits 106-107 are transmitted from interface circuits 307A, 307C, 308A, and 307E to interface circuits 312A, 312C, 313A, and 312E, respectively. Signals are not transmitted between interface circuits 307B, 307D, 308B, and 307F and interface circuits 312B, 312D, 313B, and 312F in operation 202, because operating parameters affecting signal transmission are changed in these interface circuits.

During operation 204, signals associated with write and read requests to memory array circuits 106-107 are transmitted from interface circuits 307B, 307D, 308B, and 307F to interface circuits 312B, 312D, 313B, and 312F, respectively. Signals are not transmitted between interface circuits 307A, 307C, 308A, and 307E and interface circuits 312A, 312C, 313A, and 312E in operation 204, because operating parameters affecting signal transmission are changed in these interface circuits.

In response to receiving a read request to memory array circuit 106, memory controller logic 103 generates addresses in 3 sets of address signals CAA1, CAA2, and CAA3 that identify memory locations in memory array circuit 106 where the read data requested by the read request is stored. In response to receiving a write request to memory array circuit 106, memory controller logic 103 generates addresses in address signals CAA1, CAA2, and CAA3 that identify memory locations in memory array circuit 106 where the write data is to be stored in response to the write request.

In response to receiving a read request to memory array circuit 107, memory controller logic 103 generates addresses in 3 sets of address signals CAB1, CAB2, and CAB3 that identify memory locations in memory array circuit 107 where the read data requested by the read request is stored. In response to receiving a write request to memory array circuit 107, memory controller logic 103 generates addresses in 3 sets of address signals CAB1, CAB2, and CAB3 that identify memory locations in memory array circuit 107 where the write data is to be stored in response to the write request.

Memory controller logic 103 generates each set of the 6 sets CAA1, CAA2, CAA3, CAB1, CAB2, and CAB3 of signals at a different set of its output terminals. Address signals CAA1, CAA2, and CAA3 are provided in parallel to the AI1 inputs of steering circuits 302A-302C, respectively. Address signals CAB1, CAB2, and CAB3 are provided in parallel to the AI2 inputs of steering circuits 302A-302C, respectively. Memory controller logic 103 provides two periodic clock signals CLK1 and CLK2 to the CKI1 and CKI2 inputs of steering circuit 303A, respectively.

A description is now provided regarding the transfer of addresses from memory controller logic 103 to memory array circuits 106-107 during operations 201, 203, and 205. If a read or write request to memory array circuit 106 is issued during one of operations 201, 203, or 205, steering circuits 302A-302C provide the addresses in signals CAA1, CAA2, and CAA3 from their AI1 inputs to their AO1 outputs as signals CAC1, CAC2, and CAC3, respectively. Signals CAC1, CAC2, and CAC3 are provided in parallel to the AIN inputs of interface circuits 307A, 307C, and 307E, respectively.

If a read or write request to memory array circuit 107 is issued during one of operations 201, 203, or 205, steering circuits 302A-302C provide the addresses in signals CAB1, CAB2, and CAB3 from their AI2 inputs to their AO2 outputs as signals CAD1, CAD2, and CAD3, respectively. Signals CAD1, CAD2, and CAD3 are provided in parallel to the AIN inputs of interface circuits 307B, 307D, and 307F, respectively.

Interface circuits 307A-307F include serializer circuits that convert the parallel addresses in signals CAC1, CAD1, CAC2, CAD2, CAC3, and CAD3 into serial addresses in signals CAE1, CAF1, CAE2, CAF2, CAE3, and CAF3, respectively, at their ATR outputs. Signals CAE1, CAF1, CAE2, CAF2, CAE3, and CAF3 are transmitted through conductors 130C to the ARC inputs of interface circuits 312A-312F, respectively. Conductors 130C are a subset of conductors 130.

Interface circuits 312A-312F include deserializer circuits that convert the serial addresses in signals CAE1, CAF1, CAE2, CAF2, CAE3, and CAF3 into parallel addresses in signals CAG1, CAH1, CAG2, CAH2, CAG3, and CAH3, respectively, at their AOUT outputs. Signals CAG1, CAG2, and CAG3 are provided in parallel to the AI1 inputs of steering circuits 302D-302F, respectively. Steering circuits 302D-302F provide the addresses in signals CAG1, CAG2, and CAG3 from their AI1 inputs to their AO1 outputs in signals CAI1, CAI2, and CAI3, respectively. Signals CAI1, CAI2, and CAI3 are provided in parallel to inputs of memory array circuit 106. Memory array circuit 106 stores write data at memory locations, or reads data from memory locations, indicated by the addresses in signals CAI1, CAI2, and CAI3. Each set of the 3 sets CAI1, CAI2, and CAI3 of signals is provided to a different set of inputs of memory array circuit 106.

Signals CAH1, CAH2, and CAH3 are provided in parallel to the AI2 inputs of steering circuits 302D-302F, respectively. Steering circuits 302D-302F provide the addresses in signals CAH1, CAH2, and CAH3 from their AI2 inputs to their AO2 outputs in signals CAJ1, CAJ2, and CAJ3, respectively. Signals CAJ1, CAJ2, and CAJ3 are provided in parallel to inputs of memory array circuit 107. Memory array circuit 107 stores write data at memory locations, or reads data from memory locations, indicated by the addresses in signals CAJ1, CAJ2, and CAJ3. Each set of the 3 sets CAJ1, CAJ2, and CAJ3 of signals is provided to a different set of inputs of memory array circuit 107.

A description is now provided regarding the transfer of clock signals from memory controller logic 103 to memory array circuits 106-107 during operations 201, 203, and 205. During operations 201, 203, and 205, steering circuit 303A provides clock signals CLK1 and CLK2 from its CKI1 and CKI2 inputs to its CKO1 and CKO2 outputs as clock signals CLK3 and CLK4, respectively. Clock signals CLK3 and CLK4 are provided to the CKI3 inputs of interface circuits 308A-308B, respectively. Interface circuits 308A-308B generate clock signals CLK5 and CLK6 at their CKO3 outputs in response to clock signals CLK3 and CLK4, respectively.

Clock signals CLK5 and CLK6 are transmitted to the CKI4 inputs of interface circuits 313A-313B through two of conductors 130C, respectively, as shown in FIG. 6B. Interface circuits 313A-313B generate clock signals CLK7 and CLK8 at their CKO4 outputs in response to clock signals CLK5 and CLK6, respectively. Clock signals CLK7 and CLK8 are provided to the CKI1 and CKI2 inputs of steering circuit 303B, respectively. Steering circuit 303B provides clock signals CLK7 and CLK8 from its CKI1 and CKI2 inputs to its CKO1 and CKO2 outputs as clock signals CLK9 and CLK10, respectively. Clock signal CLK9 is provided to an input of memory array circuit 106, and clock signal CLK10 is provided to an input of memory array circuit 107. Memory array circuits 106 and 107 perform memory access functions in response to clock signals CLK9 and CLK10, respectively.

A description is now provided regarding the transfer of addresses from memory controller logic 103 to memory array circuits 106-107 during operation 202. If a read or write request to memory array circuit 106 is issued during operation 202, steering circuits 302A-302C provide the addresses in signals CAA1, CAA2, and CAA3 from their AI1 inputs to their AO1 outputs as signals CAC1, CAC2, and CAC3, respectively, during a first time interval. If a read or write request to memory array circuit 107 is issued during operation 202, steering circuits 302A-302C provide the addresses in signals CAB1, CAB2, and CAB3 from their AI2 inputs to their AO1 outputs as signals CAC1, CAC2, and CAC3, respectively, during a second time interval.

Interface circuits 307A, 307C, and 307E convert the parallel addresses in signals CAC1, CAC2, and CAC3 into serial addresses in signals CAE1, CAE2, and CAE3, respectively, at their ATR outputs. Signals CAE1, CAE2, and CAE3 are transmitted through a subset of conductors 130C to the ARC inputs of interface circuits 312A, 312C, and 312E, respectively. Interface circuits 312A, 312C, and 312E convert the serial addresses in signals CAE1, CAE2, and CAE3 into parallel addresses in signals CAG1, CAG2, and CAG3, respectively, at their AOUT outputs.

Steering circuits 302D-302F provide the addresses in signals CAG1, CAG2, and CAG3 from their AI1 inputs to their AO1 outputs in signals CAI1, CAI2, and CAI3, respectively, in a third time interval. Signals CAI1, CAI2, and CAI3 indicate the same addresses as signals CAA1, CAA2, and CAA3, respectively. Steering circuits 302D-302F provide the addresses in signals CAG1, CAG2, and CAG3 from their AI1 inputs to their AO2 outputs in signals CAJ1, CAJ2, and CAJ3, respectively, in a fourth time interval. Signals CAJ1, CAJ2, and CAJ3 indicate the same addresses as signals CAB1, CAB2, and CAB3, respectively.

A description is now provided regarding the transfer of clock signals from memory controller logic 103 to memory array circuits 106-107 during operation 202. During operation 202, steering circuit 303A provides clock signal CLK1 from its CKI1 input to its CKO1 output as clock signal CLK3 in a first time interval, and steering circuit 303A provides clock signal CLK2 from its CKI2 input to its CKO1 output as clock signal CLK3 in a second time interval after the first time interval. Interface circuit 308A generates clock signal CLK5 at its CKO3 output in response to clock signal CLK3.

Clock signal CLK5 is transmitted to the CKI4 input of interface circuit 313A through one of conductors 130C. Interface circuit 313A generates clock signal CLK7 at its CKO4 output in response to clock signal CLK5. Steering circuit 303B provides clock signal CLK7 from its CKI1 input to its CKO1 output as clock signal CLK9 in a third time interval. Steering circuit 303B provides clock signal CLK7 from its CKI1 input to its CKO2 output as clock signal CLK10 in a fourth time interval after the third time interval.

A description is now provided regarding the transfer of addresses from memory controller logic 103 to memory array circuits 106-107 during operation 204. If a read or write request to memory array circuit 106 is issued during operation 204, steering circuits 302A-302C provide the addresses in signals CAM, CAA2, and CAA3 from their AI1 inputs to their AO2 outputs as signals CAD1, CAD2, and CAD3, respectively, during a first time interval. If a read or write request to memory array circuit 107 is issued during operation 204, steering circuits 302A-302C provide the addresses in signals CAB1, CAB2, and CAB3 from their AI2 inputs to their AO2 outputs as signals CAD1, CAD2, and CAD3, respectively, during a second time interval.

Interface circuits 307B, 307D, and 307F convert the parallel addresses in signals CAD1, CAD2, and CAD3 into serial addresses in signals CAF1, CAF2, and CAF3, respectively, at their ATR outputs. Signals CAF1, CAF2, and CAF3 are transmitted through a subset of conductors 130C to the ARC inputs of interface circuits 312B, 312D, and 312F, respectively. Interface circuits 312B, 312D, and 312F convert the serial addresses in signals CAF1, CAF2, and CAF3 into parallel addresses in signals CAH1, CAH2, and CAH3, respectively, at their AOUT outputs.

Steering circuits 302D-302F provide the addresses in signals CAH1, CAH2, and CAH3 from their AI2 inputs to their AO1 outputs in signals CAI1, CAI2, and CAI3, respectively, in a third time interval. Signals CAI1, CAI2, and CAI3 indicate the same addresses as signals CAA1, CAA2, and CAA3, respectively. Steering circuits 302D-302F provide the addresses in signals CAH1, CAH2, and CAH3 from their AI2 inputs to their AO2 outputs in signals CAJ1, CAJ2, and CAJ3, respectively, in a fourth time interval. Signals CAJ1, CAJ2, and CAJ3 indicate the same addresses as signals CAB1, CAB2, and CAB3, respectively.

A description is now provided regarding the transfer of clock signals from memory controller logic 103 to memory array circuits 106-107 during operation 204. During operation 204, steering circuit 303A provides clock signal CLK1 from its CKI1 input to its CKO2 output as clock signal CLK4 in a first time interval, and steering circuit 303A provides clock signal CLK2 from its CKI2 input to its CKO2 output as clock signal CLK4 in a second time interval after the first time interval. Interface circuit 308B generates clock signal CLK6 at its CKO3 output in response to clock signal CLK4.

Clock signal CLK6 is transmitted to the CKI4 input of interface circuit 313B through one of conductors 130C. Interface circuit 313B generates clock signal CLK8 at its CKO4 output in response to clock signal CLK6. Steering circuit 303B provides clock signal CLK8 from its CKI2 input to its CKO1 output as clock signal CLK9 in a third time interval. Steering circuit 303B provides clock signal CLK8 from its CKI2 input to its CKO2 output as clock signal CLK10 in a fourth time interval after the third time interval.

A set of signals SL1 and a set of signals SL2 are provided in parallel to the AIN inputs of interface circuits 309A-309B, respectively. Interface circuits 309A-309B convert parallel signals SL1 and SL2 into serial signals SL3 and SL4 at their ATR outputs, respectively. Signals SL3 and SL4 are transmitted through a subset of conductors 130C to the ARC inputs of interface circuits 314A-314B, respectively. Interface circuits 314A-314B convert serial signals SL3 and SL4 into parallel signals SL5 and SL6 at their AOUT outputs, respectively. Signals SL1, SL2, SL5, and SL6 are used to generate control signals that control steering circuits 111 and 121 as described in further detail below with respect to FIGS. 17A-17B.

Figure 7A:
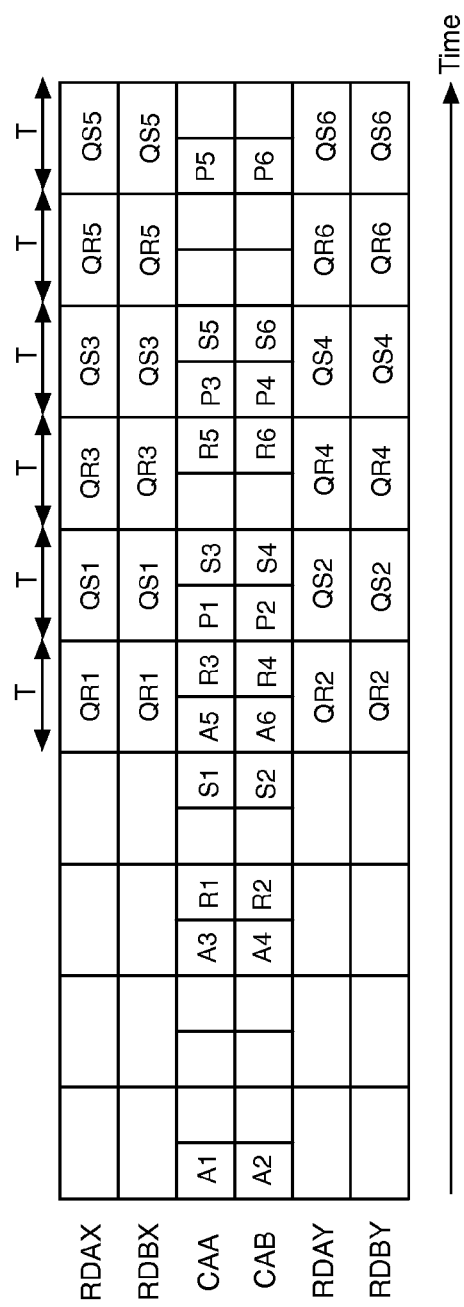
FIGS. 7A-7C are timing diagrams that illustrate the relative timing of signals transmitted between the processor integrated circuit and the memory integrated circuit in response to read requests.
Figure 7B:
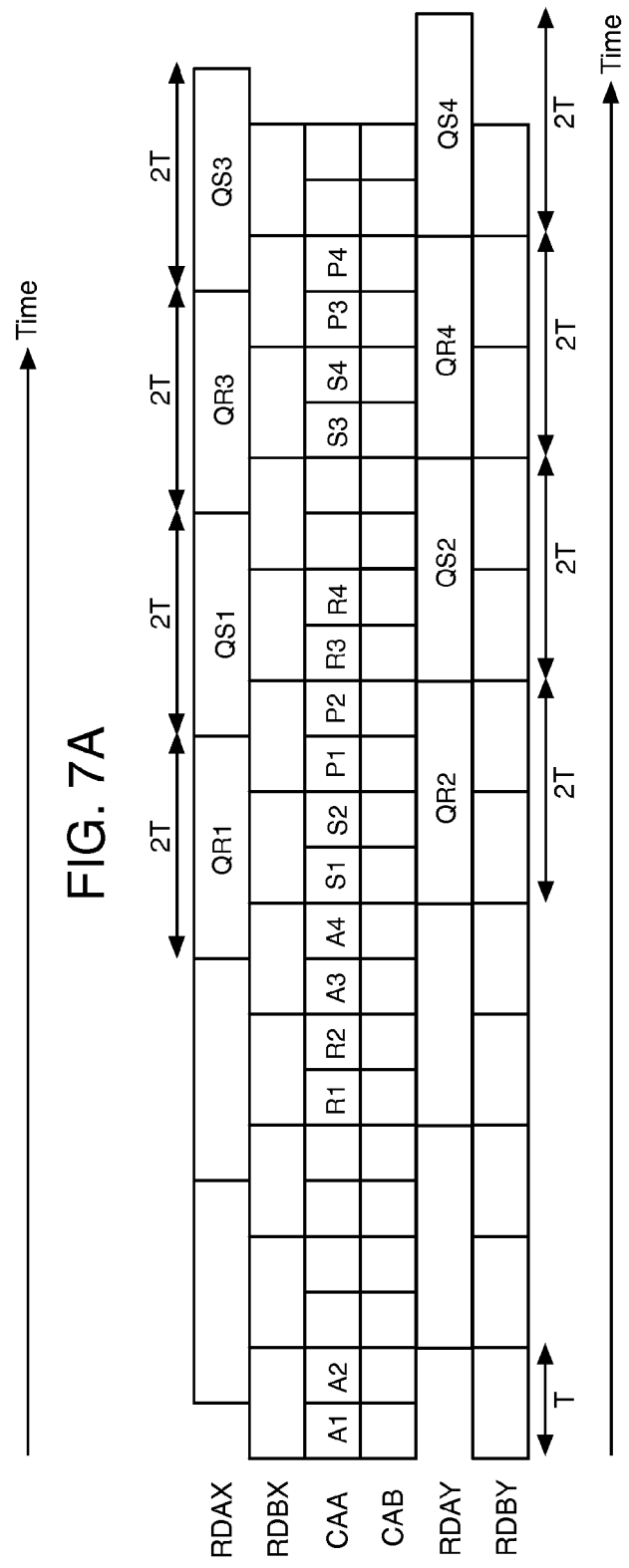
Figure 7C:
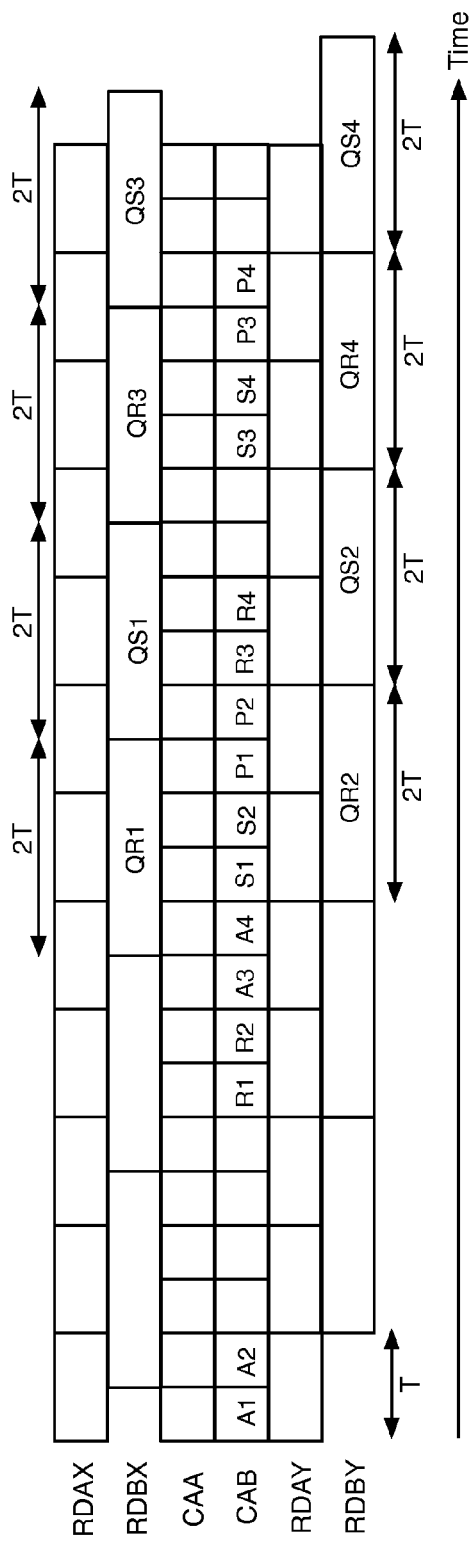

FIG. 7A is a timing diagram that illustrates the relative timing of signals transmitted between interface circuits 112 and 122 in response to read requests during operations 201, 203, and 205. FIG. 7B is a timing diagram that illustrates the relative timing of signals transmitted between interface circuits 112 and 122 in response to read requests during operation 202. FIG. 7C is a timing diagram that illustrates the relative timing of signals transmitted between interface circuits 112 and 122 in response to read requests during operation 204.

The first row RDAX of timing intervals in FIGS. 7A-7C illustrates when read data accessed from memory array circuit 106 is provided through the first subsets of interface circuits 112 and 122 discussed with respect to FIG. 2. The second row RDBX of timing intervals in FIGS. 7A-7C illustrates when read data accessed from memory array circuit 106 is provided through the second subsets of interface circuits 112 and 122 discussed with respect to FIG. 2. The third row CAA of timing intervals in FIGS. 7A-7C illustrates when addresses for read requests are provided from processor integrated circuit 101 to memory integrated circuit 102 through the first subsets of interface circuits 112 and 122.

The fourth row CAB of timing intervals in FIGS. 7A-7C illustrates when addresses for the read requests are provided from processor integrated circuit 101 to memory integrated circuit 102 through the second subsets of interface circuits 112 and 122. The fifth row RDAY of timing intervals in FIGS. 7A-7C illustrates when read data accessed from memory array circuit 107 is provided through the first subsets of interface circuits 112 and 122. The sixth row RDBY of timing intervals in FIGS. 7A-7C illustrates when read data accessed from memory array circuit 107 is provided through the second subsets of interface circuits 112 and 122.

In FIGS. 7A-7C, signals are provided through interface circuits 112 and 122 in time intervals A1, R1, S1, P1, QR1, and QS1 in response to a first read request. Signals are provided through interface circuits 112 and 122 in time intervals A2, R2, S2, P2, QR2, and QS2 in response to a second read request. Signals are provided through interface circuits 112 and 122 in time intervals A3, R3, S3, P3, QR3, and QS3 in response to a third read request. Signals are provided through interface circuits 112 and 122 in time intervals A4, R4, S4, P4, QR4, and QS4 in response to a fourth read request.

Signals are provided through interface circuits 112 and 122 in time intervals A5, R5, S5, P5, QR5, and QS5 in response to a fifth read request. Signals are provided through interface circuits 112 and 122 in time intervals A6, R6, S6, P6, QR6, and QS6 in response to a sixth read request. Data is accessed from memory array circuit 106 in response to the first, third, and fifth read requests. Data is accessed from memory array circuit 107 in response to the second, fourth, and sixth read requests.

In FIGS. 7A-7C, signals indicating row addresses for activate operations in memory array circuit 106 are provided through interface circuits 112 and 122 in time intervals A1, A3, and A5 for the first, third, and fifth read requests, respectively. Signals indicating row addresses for activate operations in memory array circuit 107 are provided through interface circuits 112 and 122 in time intervals A2, A4, and A6 for the second, fourth, and sixth read requests, respectively.

In FIGS. 7A-7C, signals indicating a column address in memory array circuit 106 for a read request are provided through interface circuits 112 and 122 in each of time intervals R1, S1, R3, S3, R5, and S5. Signals indicating a column address in memory array circuit 107 for a read request are provided through interface circuits 112 and 122 in each of time intervals R2, S2, R4, S4, R6, and S6. Read data for the read requests are accessed from memory locations at the row and column addresses.

In time intervals QR1, QS1, QR3, QS3, QR5, and QS5, read data accessed from memory array circuit 106 at the column addresses received in time intervals R1, S1, R3, S3, R5, and S5, respectively, are provided through interface circuits 112 and 122 to memory controller logic 103. In time intervals QR2, QS2, QR4, QS4, QR6, and QS6, read data accessed from memory array circuit 107 at the column addresses received in time intervals R2, S2, R4, S4, R6, and S6, respectively, are provided through interface circuits 112 and 122 to memory controller logic 103.

In time intervals P1, P3, and P5 in FIGS. 7A-7C, commands initiating pre-charge operations for the first, third, and fifth read requests, respectively, are provided through interface circuits 112 and 122 to memory array circuit 106. In time intervals P2, P4, and P6 in FIGS. 7A-7C, commands initiating pre-charge operations for the second, fourth, and sixth read requests, respectively, are provided through interface circuits 112 and 122 to memory array circuit 107.

In operations 201, 203, and 205, read data and addresses for read requests to memory array circuits 106-107 are provided through the first and second subsets of interface circuits 112 and 122, as shown in rows RDAX, RDBX, CAA, CAB, RDAY, and RDBY in FIG. 7A. In operation 202, read data and addresses for read requests to memory array circuits 106-107 are only provided through the first subsets of interface circuits 112 and 122, as shown in rows RDAX, CAA, and RDAY in FIG. 7B. In operation 204, read data and addresses for read requests to memory array circuits 106-107 are only provided through the second subsets of interface circuits 112 and 122, as shown in rows RDBX, CAB, and RDBY in FIG. 7C.

During operations 201, 203, and 205, the duration of each of time intervals QR1, QS1, QR2, QS2, QR3, QS3, QR4, QS4, QR5, QS5, QR6, and QS6 equals T, as shown in FIG. 7A. During operations 202 and 204, the duration of each of time intervals QR1, QS1, QR2, QS2, QR3, QS3, QR4, and QS4 equals 2T, as shown in FIGS. 7B-7C. The amount of time 2T for read data to propagate through interface circuits 112 and 122 in operations 202 and 204 is twice the amount of time T for read data to propagate through interface circuits 112 and 122 in operations 201, 203, and 205, because only half of interface circuits 112 and 122 transmit the read data in operations 202 and 204.

Figure 8A:
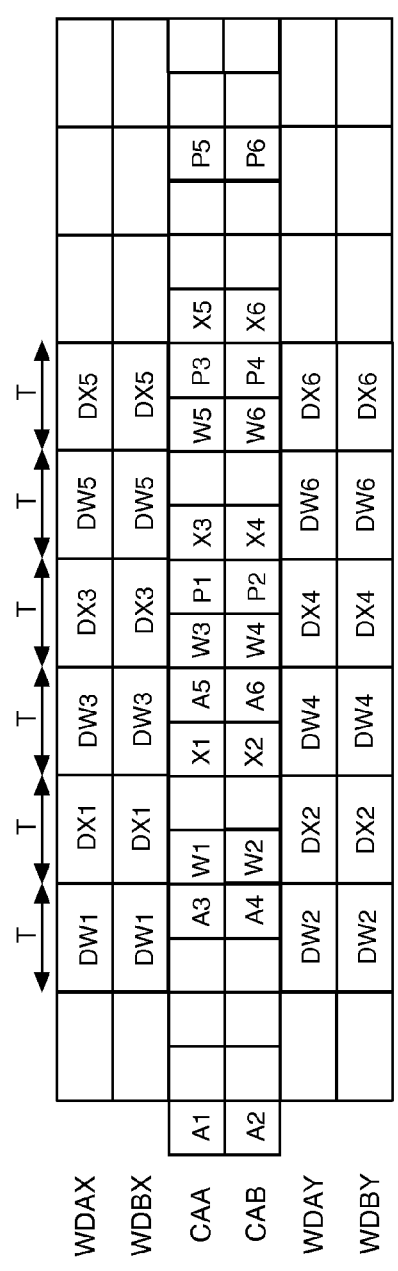
FIGS. 8A-8C are timing diagrams that illustrate the relative timing of signals transmitted between the processor integrated circuit and the memory integrated circuit in response to write requests.
Figure 8B:
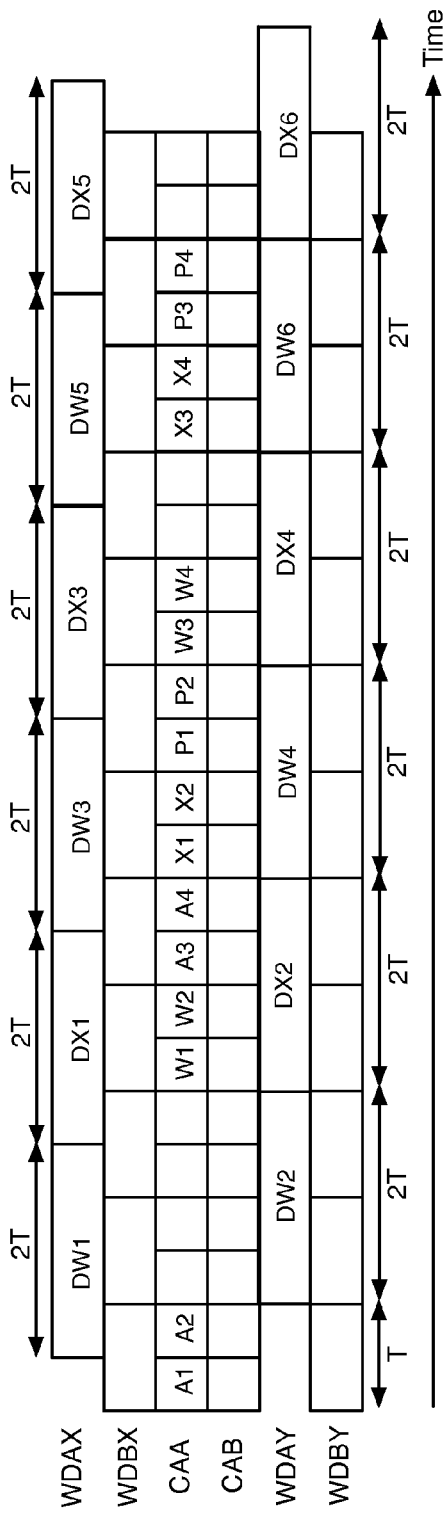
Figure 8C:
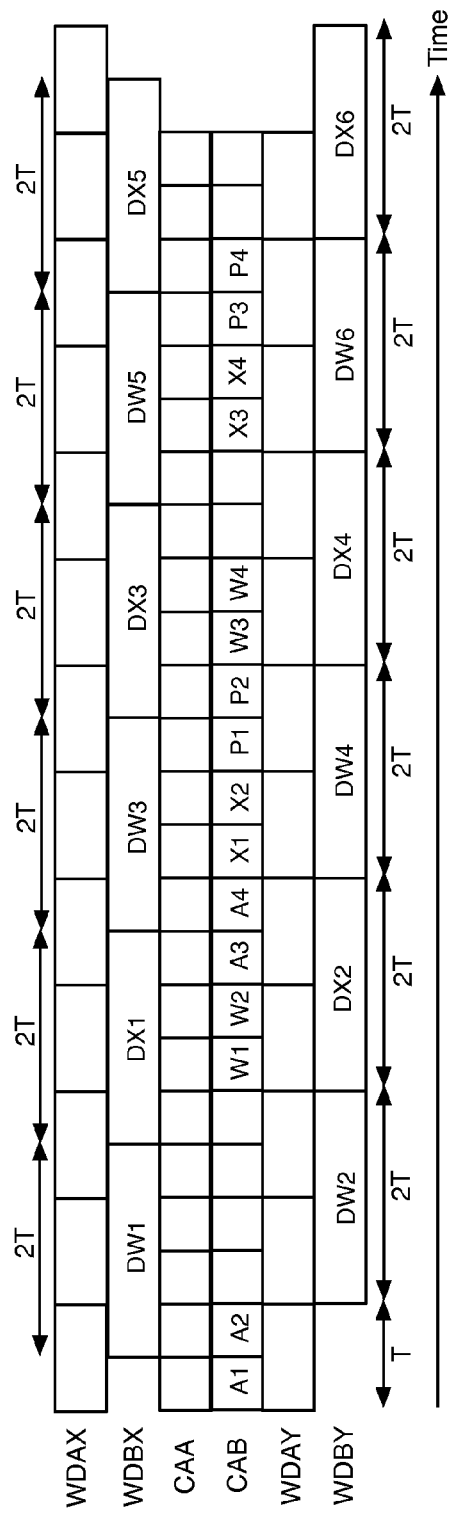

FIG. 8A is a timing diagram that illustrates the relative timing of signals transmitted between interface circuits 112 and 122 in response to write requests during operations 201, 203, and 205. FIG. 8B is a timing diagram that illustrates the relative timing of signals transmitted between interface circuits 112 and 122 in response to write requests during operation 202. FIG. 8C is a timing diagram that illustrates the relative timing of signals transmitted between interface circuits 112 and 122 in response to write requests during operation 204.

The first row WDAX of timing intervals in FIGS. 8A-8C illustrates when write data requested to be stored in memory array circuit 106 is provided through the first subsets of interface circuits 112 and 122 discussed with respect to FIG. 2. The second row WDBX of timing intervals in FIGS. 8A-8C illustrates when write data requested to be stored in memory array circuit 106 is provided through the second subsets of interface circuits 112 and 122 discussed with respect to FIG. 2. The third row CAA of timing intervals in FIGS. 8A-8C illustrates when addresses for write requests are provided from processor integrated circuit 101 to memory integrated circuit 102 through the first subsets of interface circuits 112 and 122.

The fourth row CAB of timing intervals in FIGS. 8A-8C illustrates when addresses for write requests are provided from processor integrated circuit 101 to memory integrated circuit 102 through the second subsets of interface circuits 112 and 122. The fifth row WDAY of timing intervals in FIGS. 8A-8C illustrates when write data requested to be stored in memory array circuit 107 is provided through the first subsets of interface circuits 112 and 122. The sixth row WDBY of timing intervals in FIGS. 8A-8C illustrates when write data requested to be stored in memory array circuit 107 is provided through the second subsets of interface circuits 112 and 122.

In FIGS. 8A-8C, signals are provided through interface circuits 112 and 122 in time intervals A1, W1, X1, P1, DW1, and DX1 in response to a first write request. Signals are provided through interface circuits 112 and 122 in time intervals A2, W2, X2, P2, DW2, and DX2 in response to a second write request. Signals are provided through interface circuits 112 and 122 in time intervals A3, W3, X3, P3, DW3, and DX3 in response to a third write request. Signals are provided through interface circuits 112 and 122 in time intervals A4, W4, X4, P4, DW4, and DX4 in response to a fourth write request. Signals are provided through interface circuits 112 and 122 in time intervals A5, W5, X5, P5, DW5, and DX5 in response to a fifth write request. Signals are provided through interface circuits 112 and 122 in time intervals A6, W6, X6, P6, DW6, and DX6 in response to a sixth write request. Data is stored in memory array circuit 106 in response to the first, third, and fifth write requests. Data is stored in memory array circuit 107 in response to the second, fourth, and sixth write requests.

In FIGS. 8A-8C, signals indicating row addresses for activate operations in memory array circuit 106 are provided through interface circuits 112 and 122 in time intervals A1, A3, and A5 for the first, third, and fifth write requests, respectively. Signals indicating row addresses for activate operations in memory array circuit 107 are provided through interface circuits 112 and 122 in time intervals A2, A4, and A6 for the second, fourth, and sixth write requests, respectively.

In FIGS. 8A-8C, signals indicating a column address in memory array circuit 106 for a write request are provided through interface circuits 112 and 122 in each of time intervals W1, X1, W3, X3, W5, and X5. Signals indicating a column address in memory array circuit 107 for a write request are provided through interface circuits 112 and 122 in each of time intervals W2, X2, W4, X4, W6, and X6. Write data for the write requests are stored in memory locations at the row and column addresses.

In time intervals DW1, DX1, DW3, DX3, DW5, and DX5, write data to be stored in memory array circuit 106 at the column addresses received in time intervals W1, X1, W3, X3, W5, and X5, respectively, are provided through interface circuits 112 and 122. In time intervals DW2, DX2, DW4, DX4, DW6, and DX6, write data to be stored in memory array circuit 107 at the column addresses received in time intervals W2, X2, W4, X4, W6, and X6, respectively, are provided through interface circuits 112 and 122.

In time intervals P1, P3, and P5 in FIGS. 8A-8C, commands initiating pre-charge operations for the first, third, and fifth write requests, respectively, are provided through interface circuits 112 and 122 to memory array circuit 106. In time intervals P2, P4, and P6 in FIGS. 8A-8C, commands initiating pre-charge operations for the second, fourth, and sixth write requests, respectively, are provided through interface circuits 112 and 122 to memory array circuit 107.

In operations 201, 203, and 205, write data and addresses for write requests to memory array circuits 106-107 are provided through the first and second subsets of interface circuits 112 and 122, as shown in rows WDAX, WDBX, CAA, CAB, WDAY, and WDBY in FIG. 8A. In operation 202, write data and addresses for write requests to memory array circuits 106-107 are only provided through the first subsets of interface circuits 112 and 122, as shown in rows WDAX, CAA, and WDAY in FIG. 8B. In operation 204, write data and addresses for write requests to memory array circuits 106-107 are only provided through the second subsets of interface circuits 112 and 122, as shown in rows WDBX, CAB, and WDBY in FIG. 8C.

During operations 201, 203, and 205, the duration of each of time intervals DW1, DX1, DW2, DX2, DW3, DX3, DW4, DX4, DW5, DX5, DW6, and DX6 equals T, as shown in FIG. 8A. During operations 202 and 204, the duration of each of time intervals DW1, DX1, DW2, DX2, DW3, DX3, DW4, DX4, DW5, DX5, DW6, and DX6 equals 2T, as shown in FIGS. 8B-8C. The amount of time 2T for write data to propagate through interface circuits 112 and 122 in operations 202 and 204 is twice the amount of time T for write data to propagate through interface circuits 112 and 122 in operations 201, 203, and 205, because only half of interface circuits 112 and 122 transmit the write data in operations 202 and 204.

Figure 9:
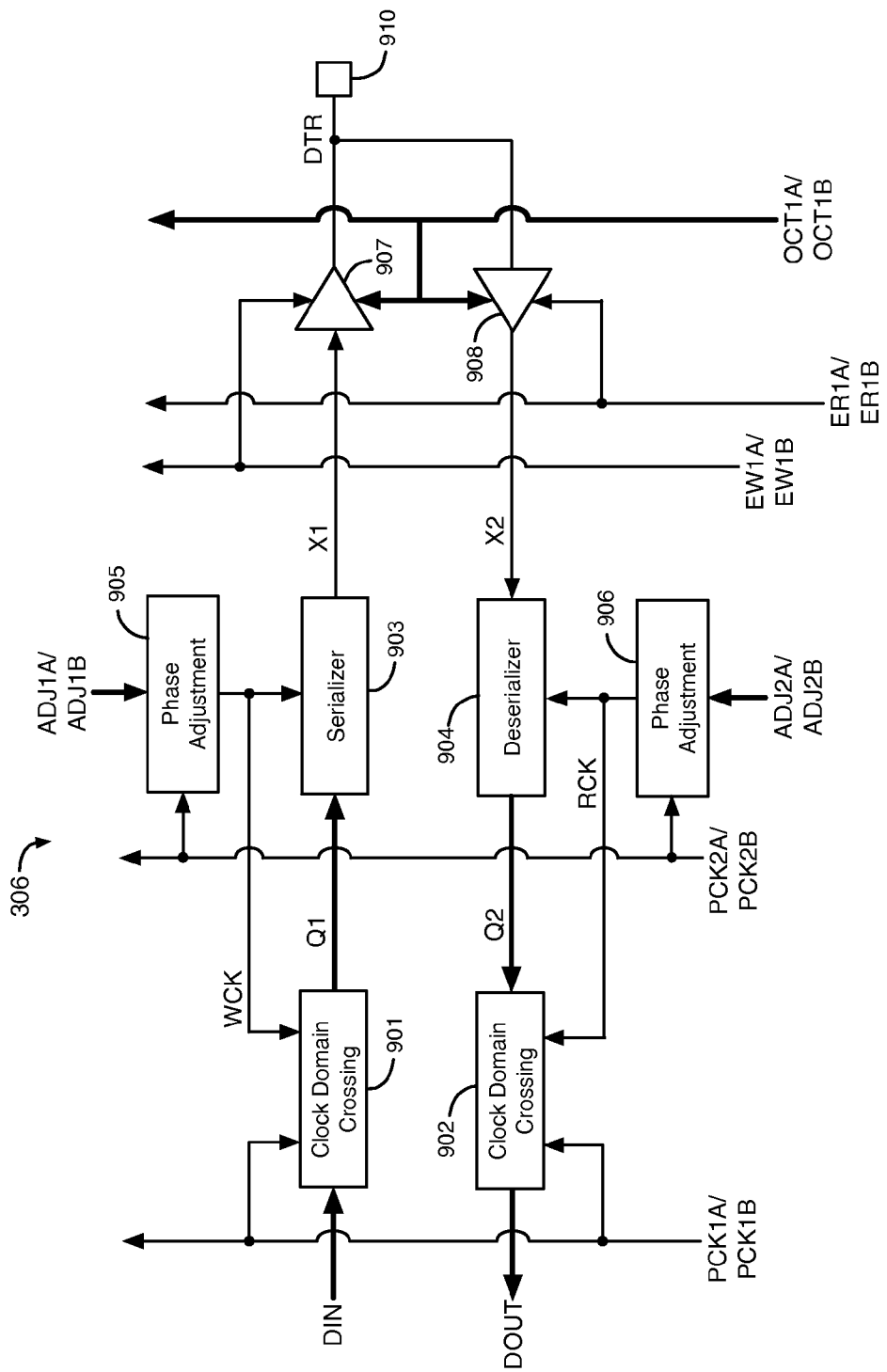
FIG. 9 illustrates an example of an interface circuit for transferring data in the processor integrated circuit.

FIG. 9 illustrates an example of an interface circuit 306. According to an embodiment, each of the 16 interface circuits 306A-306P in processor integrated circuit 101 includes the circuit structure of interface circuit 306 shown in FIG. 9. Interface circuit 306 converts parallel write data from memory controller logic 103 into serial write data for transmission outside processor integrated circuit 101. Interface circuit 306 converts serial read data received from memory integrated circuit 102 into parallel data that is provided to memory controller logic 103.

Interface circuit 306 includes clock domain crossing circuits 901-902, serializer circuit 903, deserializer circuit 904, phase adjustment circuits 905-906, transmitter buffer circuit 907, receiver buffer circuit 908, and external pin 910 of integrated circuit 101. Interface circuits 306A, 306C, 306E, 306G, 306I, 306K, 306M, and 306O are in the first subset interface circuits 112 discussed with respect to FIG. 2. Interface circuits 306B, 306D, 306F, 306H, 306J, 306L, 306N, and 306P are in the second subset of interface circuits 112 discussed with respect to FIG. 2.

In each of interface circuits 306A, 306C, 306E, 306G, 306I, 306K, 306M, and 306O, clock signal PCK1A is provided to an input of each of clock domain crossing circuits 901-902, clock signal PCK2A is provided to an input of each of phase adjustment circuits 905-906, digital control signals ADJ1A are provided to inputs of phase adjustment circuit 905, digital control signals ADJ2A are provided to inputs of phase adjustment circuit 906, digital write enable signal EW1A is provided to an input of transmitter buffer circuit 907, digital read enable signal ER1A is provided to an input of receiver buffer circuit 908, and digital on-chip termination control signals OCT1A are provided to inputs of each of transmitter and receiver buffer circuits 907-908. On-chip termination control signals OCT1A control termination impedances in buffer circuits 907-908 at pin 910 in each of interface circuits 306A, 306C, 306E, 306G, 306I, 306K, 306M, and 306O.

In each of interface circuits 306B, 306D, 306F, 306H, 306J, 306L, 306N, and 306P, clock signal PCK1B is provided to an input of each of clock domain crossing circuits 901-902, clock signal PCK2B is provided to an input of each of phase adjustment circuits 905-906, digital control signals ADJ1B are provided to inputs of phase adjustment circuit 905, digital control signals ADJ2B are provided to inputs of phase adjustment circuit 906, digital write enable signal EW1B is provided to an input of transmitter buffer circuit 907, digital read enable signal ER1B is provided to an input of receiver buffer circuit 908, and digital on-chip termination control signals OCT1B are provided to inputs of each of transmitter and receiver buffer circuits 907-908. On-chip termination control signals OCT1B control termination impedances in buffer circuits 907-908 at pin 910 in each of interface circuits 306B, 306D, 306F, 306H, 306J, 306L, 306N, and 306P.

In each of interface circuits 306A, 306C, 306E, 306G, 306I, 306K, 306M, and 306O, phase adjustment circuit 905 adjusts the phase of clock signal PCK2A based on digital control signals ADJ1A to generate a clock signal WCK. In each of interface circuits 306B, 306D, 306F, 306H, 306J, 306L, 306N, and 306P, phase adjustment circuit 905 adjusts the phase of clock signal PCK2B based on digital control signals ADJ1B to generate clock signal WCK. In an embodiment, phase adjustment circuits 905-906 are phase interpolator circuits.

Interface circuits 306A-306P receive signals indicating write data at their DIN inputs in response to write requests, as described above with respect to FIGS. 4A and 5A. The signals indicating the write data are provided in parallel to inputs of the clock domain crossing circuit 901 in the respective interface circuits 306A-306P. Clock domain crossing circuit 901 provides the write data received in the signals at inputs DIN to signals in conductors Q1. In each of interface circuits 306A, 306C, 306E, 306G, 306I, 306K, 306M, and 306O, clock domain crossing circuit 901 compares the phases of clock signals PCK1A and WCK to generate a phase shift value. In each of interface circuits 306B, 306D, 306F, 306H, 306J, 306L, 306N, and 306P, clock domain crossing circuit 901 compares the phases of clock signals PCK1B and WCK to generate a phase shift value.

In each of interface circuits 306A-306P, clock domain crossing circuit 901 adds phase shifts to the phases of parallel signals indicating write data in conductors Q1 relative to the phases of signals indicating the write data at inputs DIN that are based on the phase shift value generated in the respective interface circuit 306. In each of interface circuits 306A-306P, serializer circuit 903 converts write data in the parallel signals in conductors Q1 into serial write data in a signal in conductor X1 in response to clock signal WCK. Control signals ADJ1A and ADJ1B indicate phase shifts to add to clock signal WCK relative to clock signals PCK2A and PCK2B, respectively, to cause serializer circuit 903 to correctly sample the write data in the signals in conductors Q1.

The signal indicating the serial write data in conductor X1 is provided to an input of transmitter buffer circuit 907. Transmitter buffer circuit 907 buffers the signal indicating the serial write data in conductor X1 to generate a buffered signal indicating the serial write data at terminal DTR. Terminal DTR is coupled to external pin 910.

Each of interface circuits 306A-306P receives a signal indicating serial read data accessed from memory integrated circuit 102 at its DTR terminal in response to a read request. Receiver buffer circuit 908 in each of interface circuits 306A-306P buffers the signal indicating the serial read data at terminal DTR to generate a buffered signal indicating the serial read data in conductor X2.

In each of interface circuits 306A, 306C, 306E, 306G, 306I, 306K, 306M, and 306O, phase adjustment circuit 906 adjusts the phase of clock signal PCK2A based on digital control signals ADJ2A to generate a clock signal RCK. In each of interface circuits 306B, 306D, 306F, 306H, 306J, 306L, 306N, and 306P, phase adjustment circuit 906 adjusts the phase of clock signal PCK2B based on digital control signals ADJ2B to generate clock signal RCK. In each of interface circuits 306A-306P, deserializer circuit 904 converts serial read data in the signal in conductor X2 into read data in parallel signals in conductors Q2 in response to clock signal RCK. Control signals ADJ2A and ADJ2B indicate phase shifts to add to clock signal RCK relative to clock signals PCK2A and PCK2B, respectively, to cause deserializer circuit 904 to correctly sample the write data in conductor X2.

In each of interface circuits 306A, 306C, 306E, 306G, 306I, 306K, 306M, and 306O, clock domain crossing circuit 902 compares the phases of clock signals PCK1A and RCK to generate a phase shift value. In each of interface circuits 306B, 306D, 306F, 306H, 306J, 306L, 306N, and 306P, clock domain crossing circuit 902 compares the phases of clock signals PCK1B and RCK to generate a phase shift value.

Clock domain crossing circuit 902 provides the read data in the signals in conductors Q2 to signals at outputs DOUT. In each of interface circuits 306A-306P, clock domain crossing circuit 902 adds phase shifts to the phases of parallel signals indicating the read data at outputs DOUT relative to the phases of the parallel signals indicating the read data in conductors Q2 that are based on the phase shift value generated in the respective interface circuit 306.

In response to write requests received during operations 201-203 and 205, write enable signal EW1A enables transmitter buffer circuit 907 to generate a buffered signal at terminal DTR based on the signal in conductor X1, and read enable signal ER1A disables receiver buffer circuit 908 in each of interface circuits 306A, 306C, 306E, 306G, 306I, 306K, 306M, and 306O. In response to read requests received during operations 201-203 and 205, read enable signal ER1A enables receiver buffer circuit 908 to generate a buffered signal in conductor X2 based on the signal at terminal DTR, and write enable signal EW1A disables transmitter buffer circuit 907 in each of interface circuits 306A, 306C, 306E, 306G, 306I, 306K, 306M, and 306O. During operation 204, write enable signal EW1A disables transmitter buffer circuit 907, and read enable signal ER 1A disables receiver buffer circuit 908 in each of interface circuits 306A, 306C, 306E, 306G, 306I, 306K, 306M, and 306O.

In response to write requests received during operations 201 and 203-205, write enable signal EW1B enables transmitter buffer circuit 907 to generate a buffered signal at terminal DTR based on the signal in conductor X1, and read enable signal ER1B disables receiver buffer circuit 908 in each of interface circuits 306B, 306D, 306F, 306H, 306J, 306L, 306N, and 306P. In response to read requests received during operations 201 and 203-205, read enable signal ER1B enables receiver buffer circuit 908 to generate a buffered signal in conductor X2 based on the signal at terminal DTR, and write enable signal EW1B disables transmitter buffer circuit 907 in each of interface circuits 306B, 306D, 306F, 306H, 306J, 306L, 306N, and 306P. During operation 202, write enable signal EW1B disables transmitter buffer circuit 907, and read enable signal ER1B disables receiver buffer circuit 908 in each of interface circuits 306B, 306D, 306F, 306H, 306J, 306L, 306N, and 306P.

Figure 10:
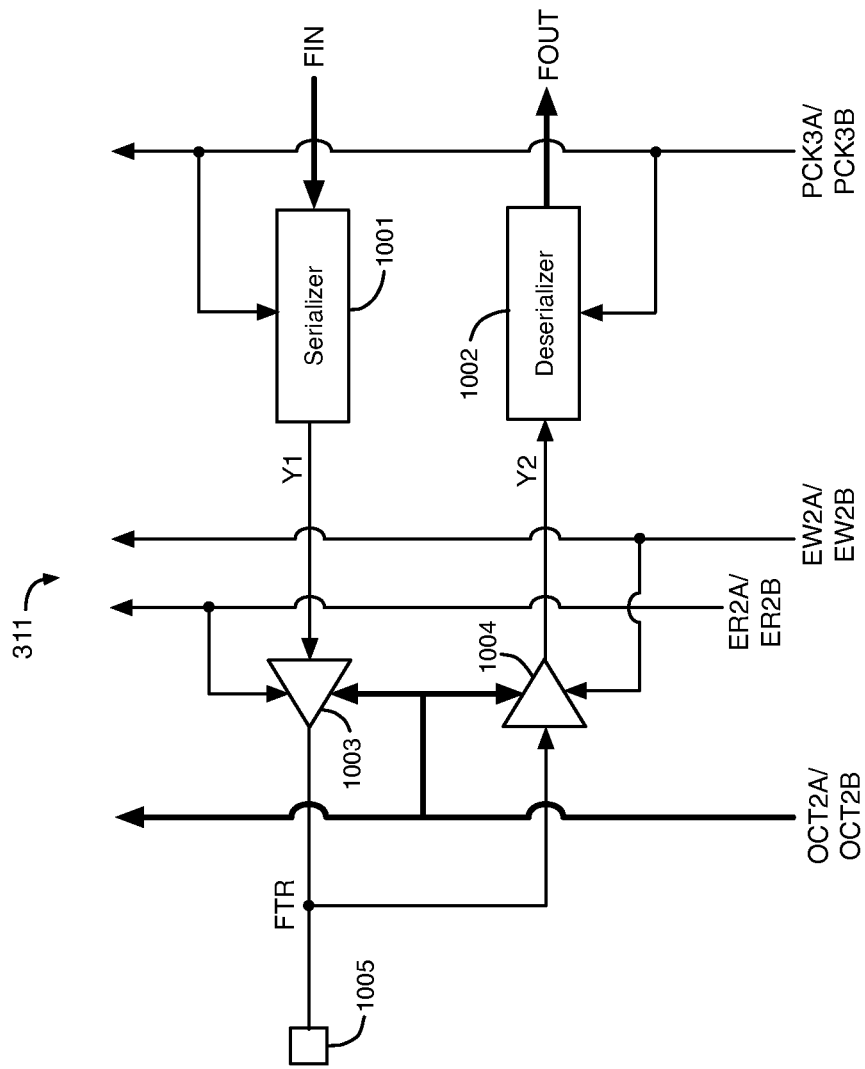
FIG. 10 illustrates an example of an interface circuit for transferring data in the memory integrated circuit.

FIG. 10 illustrates an example of an interface circuit 311. According to an embodiment, each of the 16 interface circuits 311A-311P in memory integrated circuit 102 includes the circuit structure of interface circuit 311 shown in FIG. 10. Interface circuit 311 converts serial write data received from processor integrated circuit 101 into parallel write data that is provided to memory array circuits 106-107. Interface circuit 311 converts parallel read data from memory array circuits 106-107 into serial read data that is transmitted to processor integrated circuit 101.

Interface circuit 311 includes serializer circuit 1001, deserializer circuit 1002, transmitter buffer circuit 1003, receiver buffer circuit 1004, and external pin 1005 of memory integrated circuit 102. Interface circuits 311A, 311C, 311E, 311G, 311I, 311K, 311M, and 311O are in the first subset of interface circuits 122 discussed with respect to FIG. 2. Interface circuits 311B, 311D, 311F, 311H, 311J, 311L, 311N, and 311P are in the second subset of interface circuits 122 discussed with respect to FIG. 2.

In each of interface circuits 311A, 311C, 311E, 311G, 311I, 311K, 311M, and 311O, a clock signal PCK3A is provided to inputs of serializer circuit 1001 and deserializer circuit 1002, a write enable signal EW2A is provided to an input of receiver buffer circuit 1004, a read enable signal ER2A is provided to an input of transmitter buffer circuit 1003, and digital on-chip termination control signals OCT2A are provided to inputs of each of transmitter and receiver buffer circuits 1003-1004. On-chip termination control signals OCT2A control termination impedances in buffer circuits 1003-1004 at pin 1005 in each of interface circuits 311A, 311C, 311E, 311G, 311I, 311K, 311M, and 311O.

In each of interface circuits 311B, 311D, 311F, 311H, 311J, 311L, 311N, and 311P, a clock signal PCK3B is provided to inputs of serializer circuit 1001 and deserializer circuit 1002, a write enable signal EW2B is provided to an input of receiver buffer circuit 1004, a read enable signal ER2B is provided to an input of transmitter buffer circuit 1003, and digital on-chip termination control signals OCT2B are provided to inputs of each of transmitter and receiver buffer circuits 1003-1004. On-chip termination control signals OCT2B control termination impedances in buffer circuits 1003-1004 at pin 1005 in each of interface circuits 311B, 311D, 311F, 311H, 311J, 311L, 311N, and 311P.

Interface circuits 311A-311P receive signals indicating read data at their FIN inputs in response to read requests, as described above with respect to FIGS. 4B and 5B. Signals indicating read data are provided in parallel to inputs of serializer circuit 1001 at the FIN inputs of each of the interface circuit 311A-311P. In each of interface circuits 311A, 311C, 311E, 311G, 311I, 311K, 311M, and 311O, serializer circuit 1001 converts the read data in the parallel signals at inputs FIN into serial read data in a signal in conductor Y1 in response to clock signal PCK3A. In each of interface circuits 311B, 311D, 311F, 311H, 311J, 311L, 311N, and 311P, serializer circuit 1001 converts the read data in the parallel signals at inputs FIN into serial read data in a signal in conductor Y1 in response to clock signal PCK3B.

The signal indicating the serial read data in conductor Y1 is provided to an input of transmitter buffer circuit 1003. Transmitter buffer circuit 1003 buffers the signal indicating the serial read data in conductor Y1 to generate a buffered signal indicating the serial read data at terminal FTR. Terminal FTR is coupled to external pin 1005.

Each of interface circuits 311A-311P receives a signal indicating serial write data at its FTR terminal from processor integrated circuit 101 in response to a write request. Receiver buffer circuit 1004 in each of interface circuits 311A-311P buffers the signal indicating the serial write data at terminal FTR to generate a buffered signal indicating the serial write data in conductor Y2. In each of interface circuits 311A, 311C, 311E, 311G, 311I, 311K, 311M, and 311O, deserializer circuit 1002 converts serial write data in the buffered signal in conductor Y2 into write data in parallel signals at outputs FOUT in response to clock signal PCK3A. In each of interface circuits 311B, 311D, 311F, 311H, 311J, 311L, 311N, and 311P, deserializer circuit 1002 converts serial write data in the buffered signal in conductor Y2 into write data in parallel signals at outputs FOUT in response to clock signal PCK3B.

In response to write requests received during operations 201-203 and 205, write enable signal EW2A enables receiver buffer circuit 1004 to generate a buffered signal in conductor Y2 in response to the signal at terminal FTR, and read enable signal ER2A disables transmitter buffer circuit 1003 in each of interface circuits 311A, 311C, 311E, 311G, 311I, 311K, 311M, and 311O. In response to read requests received during operations 201-203 and 205, read enable signal ER2A enables transmitter buffer circuit 1003 to generate a buffered signal at terminal FTR based on the signal in conductor Y1, and write enable signal EW2A disables receiver buffer circuit 1004 in each of interface circuits 311A, 311C, 311E, 311G, 311I, 311K, 311M, and 311O. During operation 204, write enable signal EW2A disables receiver buffer circuit 1004, and read enable signal ER2A disables transmitter buffer circuit 1003 in each of interface circuits 311A, 311C, 311E, 311G, 311I, 311K, 311M, and 311O.

In response to write requests received during operations 201 and 203-205, write enable signal EW2B enables receiver buffer circuit 1004 to generate a buffered signal in conductor Y2 based on the signal at terminal FTR, and read enable signal ER2B disables transmitter buffer circuit 1003 in each of interface circuits 311B, 311D, 311F, 311H, 311J, 311L, 311N, and 311P. In response to read requests received during operations 201 and 203-205, read enable signal ER2B enables transmitter buffer circuit 1003 to generate a buffered signal at terminal FTR based on the signal in conductor Y1, and write enable signal EW2B disables receiver buffer circuit 1004 in each of interface circuits 311B, 311D, 311F, 311H, 311J, 311L, 311N, and 311P. During operation 202, write enable signal EW2B disables receiver buffer circuit 1004, and read enable signal ER2B disables transmitter buffer circuit 1003 in each of interface circuits 311B, 311D, 311F, 311H, 311J, 311L, 311N, and 311P.

Figure 11:
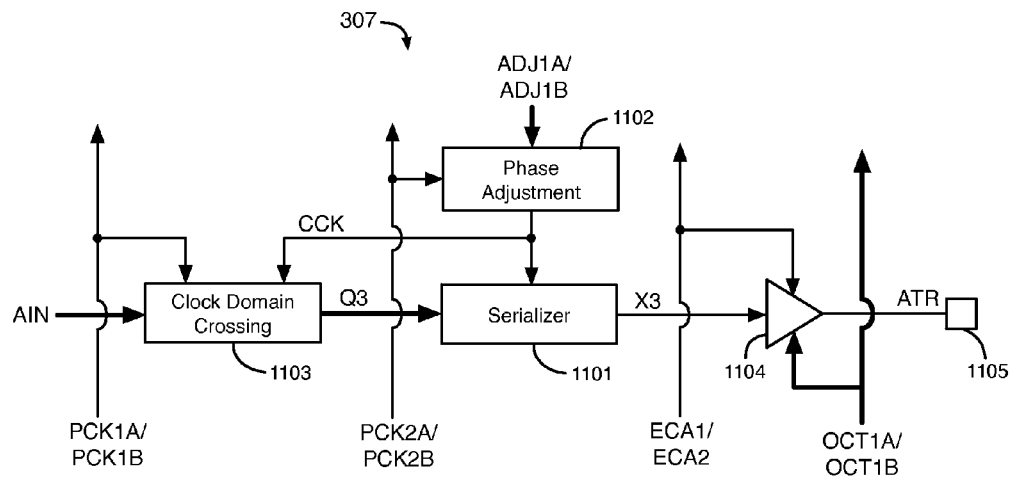
FIG. 11 illustrates an example of an interface circuit for transferring addresses in the processor integrated circuit.

FIG. 11 illustrates an example of an interface circuit 307. According to an embodiment, each of the 6 interface circuits 307A-307F in processor integrated circuit 101 includes the circuit structure of interface circuit 307 shown in FIG. 11. Interface circuit 307 converts parallel addresses from memory controller logic 103 into serial addresses that are transmitted to memory integrated circuit 102. In an embodiment, each of interface circuits 309A-309B also includes the circuit structure of interface circuit 307.

Interface circuit 307 includes a serializer circuit 1101, a phase adjustment circuit 1102, a clock domain crossing circuit 1103, a transmitter buffer circuit 1104, and an external pin 1105 of processor integrated circuit 101. Interface circuits 307A, 307C, and 307E are in the first subset interface circuits 112, and interface circuits 307B, 307D, and 307F are in the second subset of interface circuits 112.

In each of interface circuits 307A, 307C, and 307E, clock signal PCK1A is provided to an input of clock domain crossing circuit 1103, clock signal PCK2A is provided to an input of phase adjustment circuit 1102, digital control signals ADJ1A are provided to inputs of phase adjustment circuit 1102, an address enable signal ECA1 is provided to an input of transmitter buffer circuit 1104, and digital on-chip termination control signals OCT1A are provided to inputs of transmitter buffer circuit 1104. On-chip termination control signals OCT1A control a termination impedance in transmitter buffer circuit 1104 at pin 1105 in each of interface circuits 307A, 307C, and 307E.

In each of interface circuits 307B, 307D, and 307F, clock signal PCK1B is provided to an input of clock domain crossing circuit 1103, clock signal PCK2B is provided to an input of phase adjustment circuit 1102, digital control signals ADJ1B are provided to inputs of phase adjustment circuit 1102, an address enable signal ECA2 is provided to an input of transmitter buffer circuit 1104, and digital on-chip termination control signals OCT1B are provided to inputs of transmitter buffer circuit 1104. On-chip termination control signals OCT1B control a termination impedance in transmitter buffer circuit 1104 at pin 1105 in each of interface circuits 307B, 307D, and 307F.

In each of interface circuits 307A, 307C, and 307E, phase adjustment circuit 1102 adjusts the phase of clock signal PCK2A based on digital control signals ADJ1A to generate a clock signal CCK. In each of interface circuits 307B, 307D, and 307F, phase adjustment circuit 1102 adjusts the phase of clock signal PCK2B based on digital control signals ADJ1B to generate clock signal CCK. In an embodiment, phase adjustment circuit 1102 is a phase interpolator circuit.

Interface circuits 307A-307F receive signals indicating addresses at their AIN inputs in response to read and write requests, as described above with respect to FIG. 6A. The signals indicating the addresses are provided in parallel to inputs of clock domain crossing circuit 1103 in the respective interface circuits 307A-307F. In each of interface circuits 307A, 307C, and 307E, clock domain crossing circuit 1103 compares the phases of clock signals PCK1A and CCK to generate a phase shift value. In each of interface circuits 307B, 307D, and 307F, clock domain crossing circuit 1103 compares the phases of clock signals PCK1B and CCK to generate a phase shift value. Clock domain crossing circuit 1103 provides the addresses received at inputs AIN as parallel signals in conductors Q3. In each of interface circuits 307A-307F, clock domain crossing circuit 1103 adds phase shifts to the phases of the parallel signals indicating the addresses in conductors Q3 relative to the phases of the parallel signals indicating the addresses at inputs AIN that are based on the phase shift value generated in the respective interface circuit 307.

In each of interface circuits 307A-307F, serializer circuit 1101 converts the addresses in the parallel signals in conductors Q3 into serial addresses in a signal in conductor X3 in response to clock signal CCK. Control signals ADJ1A and ADJ1B indicate phase shifts to add to clock signal CCK relative to clock signals PCK2A and PCK2B, respectively, to cause serializer circuit 1101 to correctly sample the addresses in conductors Q3. The signal indicating the serial addresses in conductor X3 is provided to an input of transmitter buffer circuit 1104. Transmitter buffer circuit 1104 buffers the signal indicating the serial addresses in conductor X3 to generate a buffered signal indicating the serial addresses at terminal ATR. Terminal ATR is coupled to external pin 1105.

In response to read and write requests received during operations 201-203 and 205, address enable signal ECA1 enables transmitter buffer circuit 1104 to generate a buffered signal at terminal ATR based on the signal in conductor X3 in each of interface circuits 307A, 307C, and 307E. During operation 204, address enable signal ECA1 disables transmitter buffer circuit 1104 in each of interface circuits 307A, 307C, and 307E.

In response to read and write requests received during operations 201 and 203-205, address enable signal ECA2 enables transmitter buffer circuit 1104 to generate a buffered signal at terminal ATR based on the signal in conductor X3 in each of interface circuits 307B, 307D, and 307F. During operation 202, address enable signal ECA2 disables transmitter buffer circuit 1104 in each of interface circuits 307B, 307D, and 307F.

Figure 12:
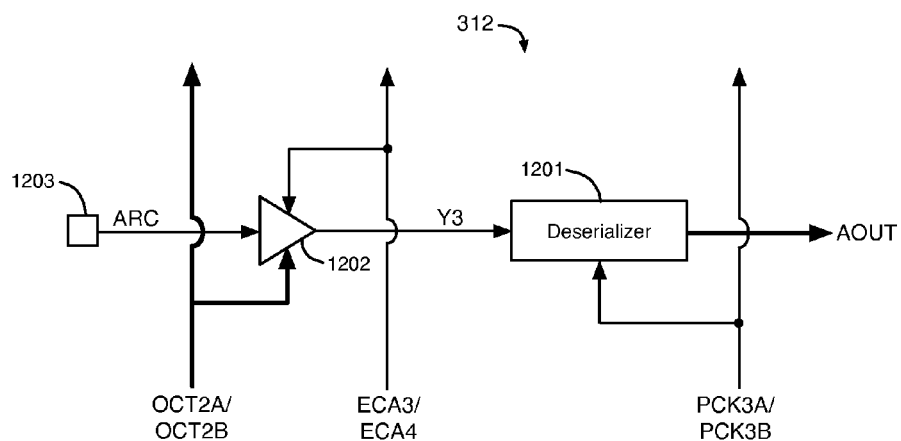
FIG. 12 illustrates an example of an interface circuit for transferring addresses in the memory integrated circuit.

FIG. 12 illustrates an example of an interface circuit 312. According to an embodiment, each of the 6 interface circuits 312A-312F in memory integrated circuit 102 includes the circuit structure of interface circuit 312 shown in FIG. 12. Interface circuit 312 converts serial addresses from processor integrated circuit 101 into parallel addresses that are provided to memory array circuits 106-107. In an embodiment, each of interface circuits 314A-314B also includes the circuit structure of interface circuit 312.

Interface circuit 312 includes deserializer circuit 1201, receiver buffer circuit 1202, and external pin 1203 of memory integrated circuit 102. Interface circuits 312A, 312C, and 312E are in the first subset of interface circuits 122, and interface circuits 312B, 312D, and 312F are in the second subset of interface circuits 122.

In each of interface circuits 312A, 312C, and 312E, clock signal PCK3A is provided to an input of deserializer circuit 1201, address enable signal ECA3 is provided to an input of receiver buffer circuit 1202, and on-chip termination control signals OCT2A are provided to inputs of receiver buffer circuit 1202. In each of interface circuits 312B, 312D, and 312F, clock signal PCK3B is provided to an input of deserializer circuit 1201, address enable signal ECA4 is provided to an input of receiver buffer circuit 1202, and on-chip termination control signals OCT2B are provided to inputs of receiver buffer circuit 1202.

On-chip termination control signals OCT2A control a termination impedance in receiver buffer circuit 1202 at pin 1203 in each of interface circuits 312A, 312C, and 312E. On-chip termination control signals OCT2B control a termination impedance in receiver buffer circuit 1202 at pin 1203 in each of interface circuits 312B, 312D, and 312F.

Interface circuits 312A-312F receive signals indicating serial addresses at their ARC terminals in response to read and write requests, as described above with respect to FIG. 6B. Receiver buffer circuit 1202 in each of interface circuits 312A-312F buffers the signal indicating the serial addresses at terminal ARC to generate a buffered signal indicating the serial addresses in conductor Y3. In each of interface circuits 312A, 312C, and 312E, deserializer circuit 1201 converts serial addresses in the buffered signal in conductor Y3 into addresses in parallel signals at outputs AOUT in response to clock signal PCK3A. In each of interface circuits 312B, 312D, and 312F, deserializer circuit 1201 converts serial addresses in the buffered signal in conductor Y3 into addresses in parallel signals at outputs AOUT in response to clock signal PCK3B.

In response to read and write requests received during operations 201-203 and 205, address enable signal ECA3 enables receiver buffer circuit 1202 to generate a buffered signal in conductor Y3 based on the signal at terminal ARC in each of interface circuits 312A, 312C, and 312E. During operation 204, address enable signal ECA3 disables receiver buffer circuit 1202 in each of interface circuits 312A, 312C, and 312E.

In response to read and write requests received during operations 201 and 203-205, address enable signal ECA4 enables receiver buffer circuit 1202 to generate a buffered signal in conductor Y3 based on the signal at terminal ARC in each of interface circuits 312B, 312D, and 312F. During operation 202, address enable signal ECA4 disables receiver buffer circuit 1202 in each of interface circuits 312B, 312D, and 312F.

Figure 13:
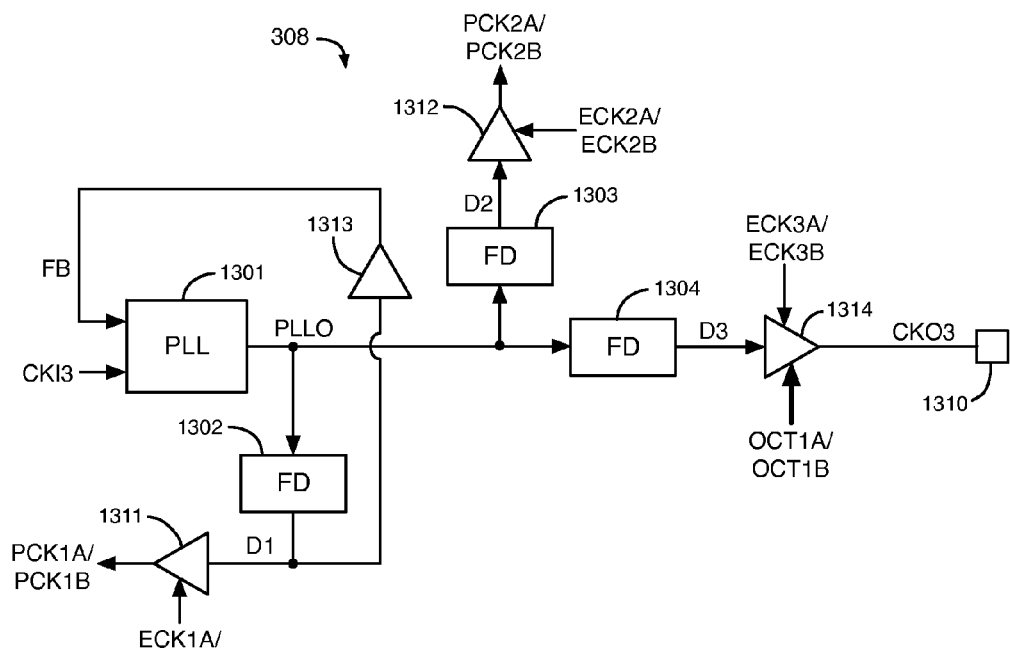
FIG. 13 illustrates an example of an interface circuit for transferring timing signals in the processor integrated circuit.

FIG. 13 illustrates an example of interface circuit 308. According to an embodiment, each of the interface circuits 308A-308B in processor integrated circuit 101 includes the circuit structure of interface circuit 308 shown in FIG. 13. Interface circuit 308 generates output clock signals in response to an input clock signal.

Interface circuit 308 includes phase-locked loop (PLL) circuit 1301, frequency divider (FD) circuits 1302-1304, buffer circuits 1311-1313, transmitter buffer circuit 1314, and external pin 1310 of processor integrated circuit 101. Interface circuit 308A is in the first subset interface circuits 112, and interface circuit 308B is in the second subset of interface circuits 112. In the embodiment of FIG. 13, each of interface circuits 308A-308B has a PLL circuit 1301. According an alternative embodiment, interface circuits 308A-308B share the same PLL circuit.

Clock signals CLK3 and CLK4 are provided to the CKI3 inputs of interface circuits 308A-308B, respectively, as shown in FIG. 6A. In each of interface circuits 308A-308B, PLL circuit 1301 generates an output clock signal at its PLLO output. The clock signal generated at the PLLO output is provided to an input of each of frequency divider circuits 1302-1304.

Frequency divider circuits 1302-1304 generate clock signals at their D1, D2, and D3 outputs, respectively, in response to the clock signal at the PLLO output of PLL circuit 1301. Frequency divider circuits 1302-1304 cause the frequencies of the clock signals at their D1, D2, and D3 outputs, respectively, to be less than the frequency of the clock signal at the PLLO output. The ratios between the frequency of the clock signal at the PLLO output and the frequencies of the clock signals at the D1, D2, and D3 outputs are programmable.

In interface circuit 308A, buffer circuit 1311 buffers the clock signal at the D1 output of frequency divider circuit 1302 to generate clock signal PCK1A. In interface circuit 308A, buffer circuit 1312 buffers the clock signal at the D2 output of frequency divider circuit 1303 to generate clock signal PCK2A.

In interface circuit 308B, buffer circuit 1311 buffers the clock signal at the D1 output of frequency divider circuit 1302 to generate clock signal PCK1B. In interface circuit 308B, buffer circuit 1312 buffers the clock signal at the D2 output of frequency divider circuit 1303 to generate clock signal PCK2B.

Buffer circuit 1313 buffers the clock signal at the D1 output of frequency divider circuit 1302 to generate a clock signal at the FB input of PLL circuit 1301 in each of interface circuits 308A-308B. PLL circuit 1301 in each of interface circuits 308A-308B is programmable to generate the clock signal at its PLLO output in response to one of the two clock signals at its CKI3 and FB inputs. The frequency of the clock signal that PLL circuit 1301 generates at its PLLO output is an example of an operating parameter of interface circuits 112 and 122 that affects signal transmission between processor integrated circuit 101 and memory integrated circuit 102.

In an embodiment, PLL circuit 1301 is reprogrammed in interface circuit 308B to generate the clock signal at its PLLO output in response to the clock signal at a different one of its CKI3 and FB inputs to change the frequency of the clock signal at its PLLO output during operation 202 in FIG. 2. In this embodiment, PLL circuit 1301 is reprogrammed in interface circuit 308A to generate the clock signal at its PLLO output in response to the clock signal at a different one of its CKI3 and FB inputs to change the frequency of the clock signal at its PLLO output during operation 204 in FIG. 2.

In each of interface circuits 308A-308B, transmitter buffer circuit 1314 buffers the clock signal at the D3 output of frequency divider circuit 1304 to generate a clock signal at output CKO3. Output CKO3 is coupled to external pin 1310. Clock signals CLK5 and CLK6 are generated at the CKO3 outputs of interface circuits 308A-308B, respectively.

In interface circuit 308A during operations 201-203 and 205, enable signal ECK1A enables buffer circuit 1311 to buffer the clock signal at the D1 output to generate clock signal PCK1A, enable signal ECK2A enables buffer circuit 1312 to buffer the clock signal at the D2 output to generate clock signal PCK2A, and enable signal ECK3A enables transmitter buffer circuit 1314 to buffer the clock signal at the D3 output to generate the clock signal at output CKO3. During operation 204, enable signals ECK1A, ECK2A, and ECK3A disable buffer circuits 1311-1312 and 1314, respectively, in interface circuit 308A.

In interface circuit 308B during operations 201 and 203-205, enable signal ECK1B enables buffer circuit 1311 to buffer the clock signal at the D1 output to generate clock signal PCK1B, enable signal ECK2B enables buffer circuit 1312 to buffer the clock signal at the D2 output to generate clock signal PCK2B, and enable signal ECK3B enables transmitter buffer circuit 1314 to buffer the clock signal at the D3 output to generate the clock signal at output CKO3. During operation 202, enable signals ECK1B, ECK2B, and ECK3B disable buffer circuits 1311-1312 and 1314, respectively, in interface circuit 308B.

On-chip termination control signals OCT1A are provided to inputs of transmitter buffer circuit 1314 in interface circuit 308A. On-chip termination control signals OCT1A control a termination impedance in transmitter buffer circuit 1314 at external pin 1310 in interface circuit 308A. On-chip termination control signals OCT1B are provided to inputs of transmitter buffer circuit 1314 in interface circuit 308B. On-chip termination control signals OCT1B control a termination impedance in transmitter buffer circuit 1314 at external pin 1310 in interface circuit 308B.

Figure 14:
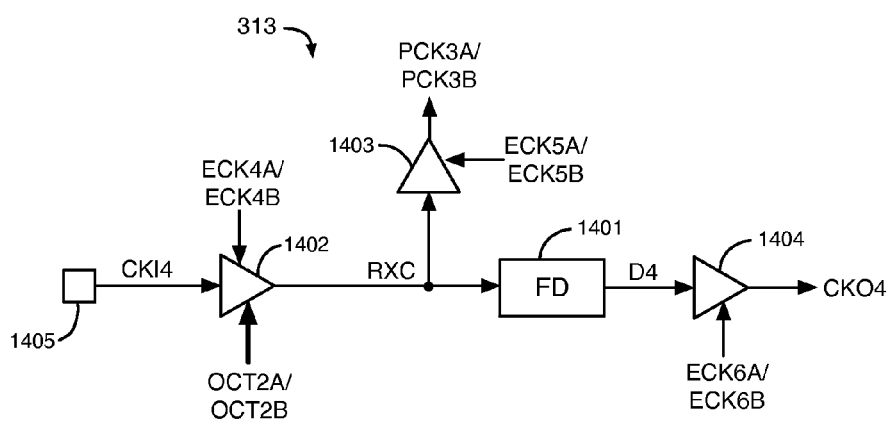
FIG. 14 illustrates an example of an interface circuit for transferring timing signals in the memory integrated circuit.

FIG. 14 illustrates an example of an interface circuit 313. According to an embodiment, each of the interface circuits 313A-313B in memory integrated circuit 102 includes the circuit structure of interface circuit 313 shown in FIG. 14. Interface circuit 313 generates an output clock signal in response to an input clock signal.

Interface circuit 313 includes frequency divider (FD) circuit 1401, receiver buffer circuit 1402, buffer circuits 1403-1404, and external pin 1405 of memory integrated circuit 102. Interface circuit 313A is in the first subset of interface circuits 122, and interface circuit 313B is in the second subset of interface circuits 122.

Clock signals CLK5 and CLK6 are provided to the CKI4 inputs of interface circuits 313A-313B, respectively, as shown in FIG. 6B. In each of interface circuits 313A-313B, receiver buffer circuit 1402 buffers the clock signal received at input CKI4 to generate a buffered clock signal at output RXC. External pin 1405 is coupled to input CKI4. In interface circuit 313A, buffer circuit 1403 buffers the clock signal at the RXC output of receiver buffer circuit 1402 to generate clock signal PCK3A. In interface circuit 313B, buffer circuit 1403 buffers the clock signal at the RXC output of receiver buffer circuit 1402 to generate clock signal PCK3B.

Frequency divider circuit 1401 generates a clock signal at its D4 output in response to the clock signal at the RXC output of receiver buffer circuit 1402. Frequency divider circuit 1401 causes the frequency of the clock signal at its D4 output to be a fraction of the frequency of the clock signal at the RXC output. The ratio between the frequency of the clock signal at the RXC output and the frequency of the clock signal at the D4 output is programmable.

Buffer circuit 1404 buffers the clock signal at the D4 output of frequency divider circuit 1401 to generate a buffered clock signal at the CKO4 output of each of interface circuits 313A-313B. Interface circuits 313A-313B generate clock signals CLK7 and CLK8, respectively, at their CKO4 outputs, as shown in FIG. 6B.

In interface circuit 313A during operations 201-203 and 205, enable signal ECK4A enables receiver buffer circuit 1402 to buffer the clock signal at input CKI4 to generate the clock signal at the RXC output, enable signal ECK5A enables buffer circuit 1403 to buffer the clock signal at the RXC output to generate clock signal PCK3A, and enable signal ECK6A enables buffer circuit 1404 to buffer the clock signal at the D4 output to generate the clock signal at the CKO4 output. During operation 204, enable signals ECK4A, ECK5A, and ECK6A disable buffer circuits 1402-1404, respectively, in interface circuit 313A.

In interface circuit 313B during operations 201 and 203-205, enable signal ECK4B enables receiver buffer circuit

1402 to buffer the clock signal at input CKI4 to generate the clock signal at the RXC output, enable signal ECK5B enables buffer circuit 1403 to buffer the clock signal at the RXC output to generate clock signal PCK3B, and enable signal ECK6B enables buffer circuit 1404 to buffer the clock signal at the D4 output to generate the clock signal at the CKO4 output. During operation 202, enable signals ECK4B, ECK5B, and ECK6B disable buffer circuits 1402-1404, respectively, in interface circuit 313B.

On-chip termination control signals OCT2A are provided to inputs of receiver buffer circuit 1402 in interface circuit 313A. On-chip termination control signals OCT2A control a termination impedance in receiver buffer circuit 1402 at external pin 1405 in interface circuit 313A. On-chip termination control signals OCT2B are provided to inputs of receiver buffer circuit 1402 in interface circuit 313B. On-chip termination control signals OCT2B control a termination impedance in receiver buffer circuit 1402 at external pin 1405 in interface circuit 313B.

Figure 15A:
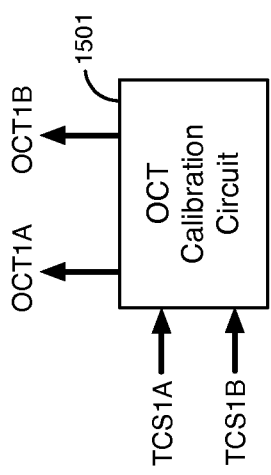
FIGS. 15A-15B illustrate examples of on-chip termination control circuits in the processor and memory integrated circuits, respectively.

FIG. 15A illustrates a box that represents an example of an on-chip termination (OCT) calibration circuit in processor integrated circuit 101. OCT calibration circuit 1501 generates on-chip termination control signals OCT1A based on a first set of termination control signals TCS1A. OCT calibration circuit 1501 varies on-chip termination control signals OCT1A based on changes in termination control signals TCS1A. OCT calibration circuit 1501 generates on-chip termination control signals OCT1B based on a second set of termination control signals TCS1B. OCT calibration circuit 1501 varies on-chip termination control signals OCT1B based on changes in termination control signals TCS1B.

Buffer circuits 907-908, 1104, and 1314 in the first subset of interface circuits 112 vary the on-chip termination impedance at pins 910, 1105, and 1310, respectively, based on changes in on-chip termination control signals OCT1A. Buffer circuits 907-908, 1104, and 1314 in the second subset of interface circuits 112 vary the on-chip termination impedance at pins 910, 1105, and 1310, respectively, based on changes in on-chip termination control signals OCT1B.

Figure 15B:
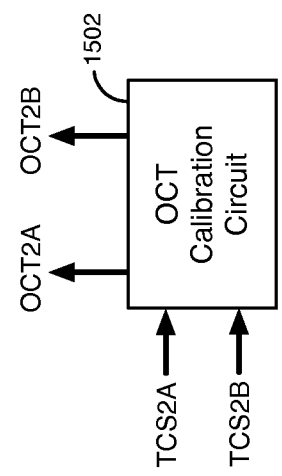

FIG. 15B illustrates a box 1502 that represents an example of an on-chip termination calibration circuit in memory integrated circuit 102. OCT calibration circuit 1502 generates on-chip termination control signals OCT2A based on a first set of termination control signals TCS2A. OCT calibration circuit 1502 varies on-chip termination control signals OCT2A based on changes in termination control signals TCS2A. OCT calibration circuit 1502 generates on-chip termination control signals OCT2B based on a second set of termination control signals TCS2B. OCT calibration circuit 1502 varies on-chip termination control signals OCT2B based on changes in termination control signals TCS2B.

Buffer circuits 1003-1004, 1202, and 1402 in the first subset of interface circuits 122 vary the on-chip termination impedance at pins 1005, 1203, and 1405, respectively, based on changes in on-chip termination control signals OCT2A. Buffer circuits 1003-1004, 1202, and 1402 in the second subset of interface circuits 122 vary the on-chip termination impedance at pins 1005, 1203, and 1405, respectively, based on changes in on-chip termination control signals OCT2B.

The on-chip termination impedances in buffer circuits 907-908, 1003-1004, 1104, 1202, 1314, and 1402 are examples of operating parameters of interface circuits 112 and 122 that affect signal transmission between processor integrated circuit 101 and memory integrated circuit 102. In an embodiment, OCT calibration circuits 1501-1502 change the on-chip termination impedances in the second subsets of interface circuits 112 and 122 during operation 202 in FIG. 2, and OCT calibration circuits 1501-1502 change the on-chip termination impedances in the first subsets of interface circuits 112 and 122 during operation 204 in FIG. 2.

Figure 16A:
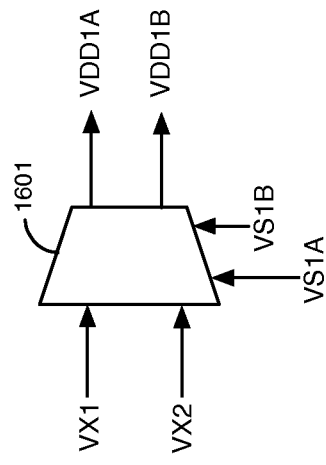
FIGS. 16A-16B illustrate examples of multiplexer circuits used to select supply voltages in the processor and memory integrated circuits, respectively.

FIG. 16A illustrates an example of a multiplexer circuit 1601 in processor integrated circuit 101. Multiplexer circuit 1601 determines the voltages of two supply voltages VDD1A and VDD1B in processor integrated circuit 101. Supply voltage VDD1A is provided as a supply voltage for the circuits in the first subset of interface circuits 112, and VDD1B is provided as a supply voltage for the circuits in the second subset of interface circuits 112.

Two supply voltages VX1 and VX2 are provided to multiplexing inputs of multiplexer circuit 1601. Two select signals VS1A and VS1B are provided to select inputs of multiplexer circuit 1601. Multiplexer circuit 1601 causes supply voltage VDD1A to equal the voltage of one of supply voltages VX1 or VX2 based on the select signal VS1A. Multiplexer circuit 1601 causes supply voltage VDD1B to equal the voltage of one of supply voltages VX1 or VX2 based on the select signal VS1B.

Figure 16B:
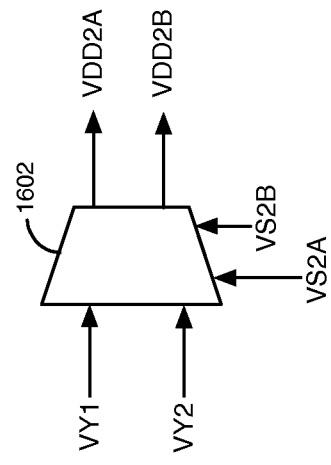

FIG. 16B illustrates an example of a multiplexer circuit 1602 in memory integrated circuit 102. Multiplexer circuit 1602 determines the voltages of two supply voltages VDD2A and VDD2B in memory integrated circuit 102. Supply voltage VDD2A is provided as a supply voltage for the circuits in the first subset of interface circuits 122, and VDD2B is provided as a supply voltage for the circuits in the second subset of interface circuits 122.

Two supply voltages VY1 and VY2 are provided to multiplexing inputs of multiplexer circuit 1602. Two select signals VS2A and VS2B are provided to select inputs of multiplexer circuit 1602. Multiplexer circuit 1602 causes supply voltage VDD2A to equal the voltage of one of supply voltages VY1 or VY2 based on select signal VS2A. Multiplexer circuit 1602 causes supply voltage VDD2B to equal the voltage of one of supply voltages VY1 or VY2 based on select signal VS2B.

The supply voltages provided to interface circuits 112 and 122 are examples of operating parameters that affect signal transmission between processor integrated circuit 101 and memory integrated circuit 102. In an embodiment, multiplexer circuits 1601-1602 change the supply voltages provided to the second subsets of interface circuits 112 and 122 during operation 202 in FIG. 2, and multiplexer circuits 1601-1602 change the supply voltages provided to the first subsets of interface circuits 112 and 122 during operation 204 in FIG. 2.

Figure 17A:
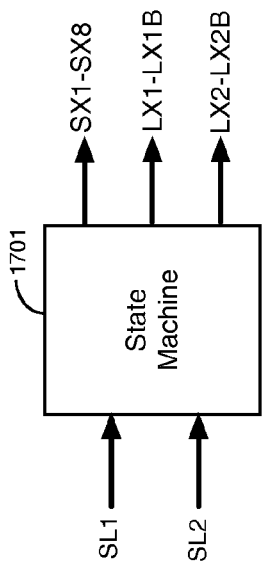
FIGS. 17A-17B illustrate examples of state machines for generating control signals in the processor and memory integrated circuits, respectively.

FIG. 17A illustrates an example of a state machine 1701 in processor integrated circuit 101. State machine 1701 receives signals SL1 and signals SL2 at inputs. State machine 1701 generates control signals SX1, SX2, SX3, SX4, SX5, SX6, SX7, SX8, LX1, LX1B, LX2, and LX2B based on signals SL1 and signals SL2. Signals LX1 and LX1B are complementary periodic signals. Signals LX2 and LX2B are complementary periodic signals.

Figure 17B:
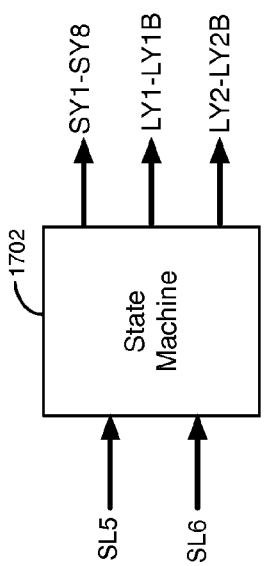

FIG. 17B illustrates an example of a state machine 1702 in memory integrated circuit 102. State machine 1702 receives signals SL5 and signals SL6 at inputs. State machine 1702 generates control signals SY1, SY2, SY3, SY4, SY5, SY6, SY7, SY8, LY1, LY1B, LY2, and LY2B based on signals SL5 and signals SL6. Signals LY1 and LY1B are complementary periodic signals. Signals LY2 and LY2B are complementary periodic signals.

Figure 18:
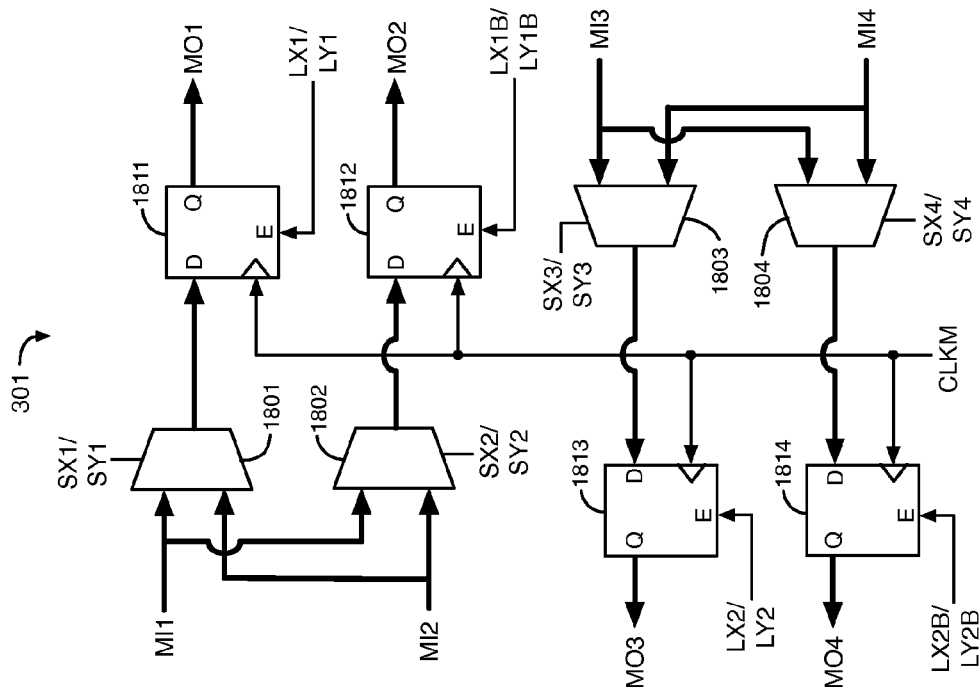
FIG. 18 illustrates an example of a steering circuit for providing data in the processor and memory integrated circuits.

FIG. 18 illustrates an example of a steering circuit 301. According to an embodiment, each of steering circuits 301A-301P includes the circuit structure of steering circuit 301 shown in FIG. 18. Steering circuit 301 includes four sets of multiplexer circuits 1801-1804 and four sets of registers 1811-1814.

The signals received at the MI1 inputs of steering circuit 301 are provided in parallel to multiplexing inputs of multiplexer circuits 1801 and 1802. The signals received at the MI2 inputs of steering circuit 301 are provided in parallel to multiplexing inputs of multiplexer circuits 1801 and 1802. The signals received at the MI3 inputs of steering circuit 301 are provided in parallel to multiplexing inputs of multiplexer circuits 1803 and 1804. The signals received at the MI4 inputs of steering circuit 301 are provided in parallel to multiplexing inputs of multiplexer circuits 1803 and 1804.

In steering circuits 301A-301H in processor integrated circuit 101, signals SX1, SX2, SX3, and SX4 are provided to the select inputs of multiplexer circuits 1801-1804, respectively. In steering circuits 301I-301P in memory integrated circuit 102, signals SY1, SY2, SY3, and SY4 are provided to the select inputs of multiplexer circuits 1801-1804.

Multiplexer circuits 1801 provide the values of the signals at either the MI1 inputs or the MI2 inputs to the D inputs of register circuits 1811 based on signal SX1 or signal SY1. Multiplexer circuits 1802 provide the values of the signals at either the MI1 inputs or the MI2 inputs to the D inputs of register circuits 1812 based on signal SX2 or signal SY2. Multiplexer circuits 1803 provide the values of the signals at either the MI3 inputs or the MI4 inputs to the D inputs of register circuits 1813 based on signal SX3 or signal SY3. Multiplexer circuits 1804 provide the values of the signals at either the MI3 inputs or the MI4 inputs to the D inputs of register circuits 1814 based on signal SX4 or signal SY4.

A clock signal CLKM is provided to clock inputs of register circuits 1811-1814. In steering circuits 301A-301H, signals LX1, LX1B, LX2, and LX2B are provided to the E inputs of register circuits 1811-1814, respectively. In steering circuits 301I-301P, signals LY1, LY1B, LY2, and LY2B are provided to the E inputs of register circuits 1811-1814, respectively. The E inputs of register circuits 1811-1814 are enable inputs. Register circuits 1811-1814 provide the values of the signals at their D inputs to their Q outputs in response to clock signal CLKM and the signals at their respective E inputs. Signals SX1-SX4, SY1-SY4, LX1-LX1B, LX2-LX2B, LY1-LY1B, LY2-LY2B, and CLKM cause steering circuits 301A-301P to function as described above with respect to FIGS. 4A-5B.

Register circuits 1811-1814 are storage circuits that store the signals at their Q outputs. The signals stored at the Q outputs of register circuits 1811-1814 are provided to the MO1-MO4 outputs of steering circuit 301, respectively.

Figure 19:
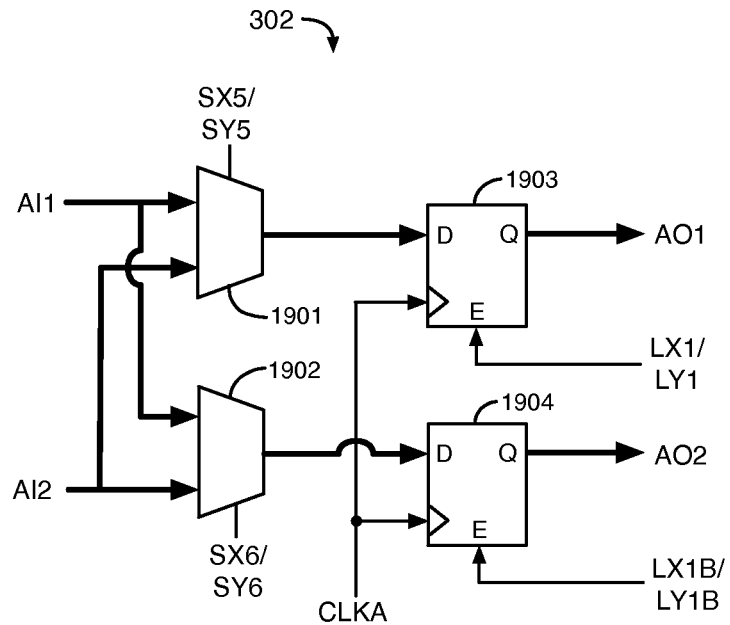
FIG. 19 illustrates an example of a steering circuit for providing addresses in the processor and memory integrated circuits.

FIG. 19 illustrates an example of a steering circuit 302. According to an embodiment, each of the steering circuits 302A-302F shown in FIGS. 6A-6B includes the circuit structure of steering circuit 302 shown in FIG. 19. Steering circuit 302 includes two sets of multiplexer circuits 1901-1902 and two sets of register circuits 1903-1904.

The signals received at the AI1 inputs of steering circuit 302 are provided in parallel to multiplexing inputs of multiplexer circuits 1901-1902. The signals received at the AI2 inputs of steering circuits 302 are provided in parallel to multiplexing inputs of multiplexer circuits 1901-1902. In steering circuits 302A-302C, signal SX5 is provided to the select inputs of multiplexer circuits 1901, and signal SX6 is provided to the select inputs of multiplexer circuits 1902. In steering circuits 302D-302F, signal SY5 is provided to the select inputs of multiplexer circuits 1901, and signal SY6 is provided to the select inputs of multiplexer circuits 1902.

Multiplexer circuits 1901 provide the values of the signals at either the AI1 inputs or the AI2 inputs to the D inputs of register circuits 1903 based on signal SX5 or signal SY5. Multiplexer circuits 1902 provide the values of the signals at either the AI1 inputs or the AI2 inputs to the D inputs of register circuits 1904 based on signal SX6 or signal SY6.

A clock signal CLKA is provided to clock inputs of register circuits 1903-1904. In steering circuits 302A-302C, signals LX1 and LX1B are provided to the E inputs of register circuits 1903-1904, respectively. In steering circuits 302D-302F, signals LY1 and LY1B are provided to the E inputs of register circuits 1903-1904, respectively. The E inputs of register circuits 1903-1904 are enable inputs. Register circuits 1903-1904 provide the values of the signals at their D inputs to their Q outputs in response to clock signal CLKA and the signals at their respective E inputs. Signals SX5-SX6, SY5-SY6, LX1-LX1B, LY1-LY1B, and CLKA cause steering circuits 302A-302F to function as described above with respect to FIGS. 6A-6B.

Register circuits 1903-1904 are storage circuits that store the signals at their Q outputs. The signals stored at the Q outputs of register circuits 1903 are provided to the AO1 outputs of steering circuit 302. The signals stored at the Q outputs of register circuit 1904 are provided to the AO2 outputs of steering circuit 302.

Figure 20:
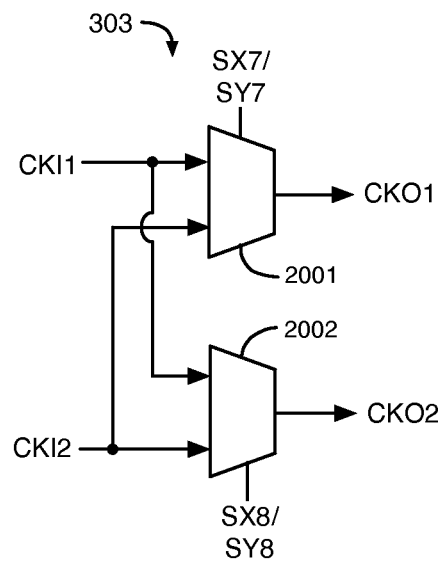
FIG. 20 illustrates an example of a steering circuit for providing timing signals in the processor and memory integrated circuits.

FIG. 20 illustrates an example of a steering circuit 303. According to an embodiment, each of steering circuits 303A-303B includes the circuit structure of steering circuit 303 shown in FIG. 20. Steering circuit 303 includes multiplexer circuits 2001-2002. The clock signals received at the CKI1 and CKI2 inputs of steering circuit 303 are provided to the multiplexing inputs of each of multiplexer circuits 2001-2002.

In steering circuit 303A, signal SX7 is provided to the select input of multiplexer circuit 2001, and signal SX8 is provided to the select input of multiplexer circuit 2002. In steering circuit 303B, signal SY7 is provided to the select input of multiplexer circuit 2001, and signal SY8 is provided to the select input of multiplexer circuit 2002. Multiplexer circuit 2001 provides the clock signal at input CKI1 or input CKI2 to output CKO1 based on signal SX7 or signal SY7. Multiplexer circuit 2002 provides the clock signal at input CKI1 or input CKI2 to output CKO2 based on signal SX8 or signal SY8. Signals SX7, SY7, SX8, and SY8 cause steering circuits 303A-303B to function as described above with respect to FIGS. 6A-6B.

The foregoing description of the exemplary embodiments has been presented for the purposes of illustration and description. The foregoing description is not intended to be exhaustive or limiting to the examples disclosed herein. In some instances, certain features of the embodiments can be employed without a corresponding use of other features as set forth. Many modifications, substitutions, and variations are possible in light of the above teachings, without departing from the scope of the claims.

What is claimed is:

1. A memory integrated circuit comprising:
   first and second memory arrays;
   a first interface to receive a signal for accessing a memory location in one of the first and the second memory arrays during a first time interval; and
   a second interface to receive a signal for accessing a memory location in one of the first and the second memory arrays during the first time interval;
   wherein the first interface receives signals for accessing memory locations in the first and the second memory arrays during a second time interval, wherein the second interface is disabled from accessing the first and the second memory arrays during the second time interval, and wherein at least one of a signaling rate of a signal received by the second interface, a supply voltage of the second interface, an on-chip termination impedance provided by the second interface, and a voltage amplitude of a signal received by the second interface is adjusted during the second time interval.

2. The memory integrated circuit of claim 1, wherein the first interface receives a signal for accessing a memory location in the first memory array and the second interface receives a signal for accessing a memory location in the second memory array during a third time interval after the second time interval, and wherein at least one of the signaling rate of a signal received by the second interface, the supply voltage of the second interface, the on-chip termination impedance provided by the second interface, and the voltage amplitude of a signal received by the second interface is different during the third time interval relative to the first time interval.

3. The memory integrated circuit of claim 2, wherein the second interface receives signals for accessing memory locations in the first and the second memory arrays during a fourth time interval while the first interface is disabled from accessing the first and the second memory arrays, and wherein at least one of a signaling rate of a signal received by the first interface, a supply voltage of the first interface, an on-chip termination impedance provided by the first interface, and a voltage amplitude of a signal received by the first interface is adjusted during the fourth time interval.

4. The memory integrated circuit of claim 3, wherein the first interface receives a signal for accessing a memory location in the first memory array and the second interface receives a signal for accessing a memory location in the second memory array during a fifth time interval after the fourth time interval, and wherein at least one of the signaling rate of a signal received by the first interface, the supply voltage of the first interface, the on-chip termination impedance provided by the first interface, and the voltage amplitude of a signal received by the first interface is different during the fifth time interval relative to the first, the second, and the third time intervals.

5. The memory integrated circuit of claim 1, wherein the first interface comprises a first control interface that receives first address signals for accessing memory locations in the first memory array during the first time interval, wherein the second interface comprises a second control interface that receives second address signals for accessing memory locations in the second memory array during the first time interval, and wherein the first control interface receives third address signals for accessing memory locations in each of the first and the second memory arrays during the second time interval.

6. The memory integrated circuit of claim 1, wherein the first interface comprises a first control interface that receives a first timing signal for the first memory array during the first time interval, wherein the second interface comprises a second control interface that receives a second timing signal for the second memory array during the first time interval, and wherein the first control interface receives a third timing signal for the first memory array and a fourth timing signal for the second memory array during the second time interval.

7. The memory integrated circuit of claim 1, wherein the first and the second interfaces receive first data signals for storing data in the first memory array and second data signals for storing data in the second memory array during the first time interval, and wherein the first interface receives third data signals for storing data in the first memory array and fourth data signals for storing data in the second memory array during the second time interval.

8. The memory integrated circuit of claim 1, wherein the first and the second interfaces transmit first data signals indicating data accessed from the first memory array and second data signals indicating data accessed from the second memory array during the first time interval, and wherein the first interface transmits third data signals indicating data accessed from the first memory array and fourth data signals indicating data accessed from the second memory array during the second time interval.

9. The memory integrated circuit of claim 1 further comprising:
a steering circuit to transfer data and addresses between the first and the second interfaces and the first and the second memory arrays.

10. The memory integrated circuit of claim 9 wherein the steering circuit comprises a first multiplexer to receive signals from the first and the second interfaces, and a second multiplexer to receive signals from the first and the second interfaces.

11. The memory integrated circuit of claim 10 wherein the steering circuit further comprises a first register to store a first signal based on a signal selected by the first multiplexer and a second register to store a second signal based on a signal selected by the second multiplexer.

12. The memory integrated circuit of claim 1 further comprising:
an on-chip termination calibration circuit to control the on-chip termination impedance provided by the second interface.

13. The memory integrated circuit of claim 1 further comprising:
a supply voltage select circuit to control the supply voltage of the second interface.

14. A method of operation in a memory integrated circuit comprising first and second memory arrays, the method comprising:
receiving a signal for accessing a memory location in one of the first and the second memory arrays at a first interface during a first time interval;
receiving a signal for accessing a memory location in one of the first and the second memory arrays at a second interface during the first time interval; and
receiving signals for accessing memory locations in each of the first and the second memory arrays at the first interface during a second time interval while the second interface is disabled from accessing each of the first and the second memory arrays,
wherein at least one of a signaling rate of a signal received by the second interface, a supply voltage of the second interface, an on-chip termination impedance provided by the second interface, and a voltage amplitude of a signal received by the second interface is adjusted during the second time interval.

15. The method of claim 14 further comprising:
receiving a signal for accessing a memory location in the first memory array at the first interface during a third time interval after the second time interval; and
receiving a signal for accessing a memory location in the second memory array at the second interface during the third time interval,
wherein at least one of the signaling rate of a signal received by the second interface, the supply voltage of the second interface, the on-chip termination impedance provided by the second interface, and the voltage amplitude of a signal received by the second interface is different during the third time interval relative to the first time interval.

16. The method of claim 15 further comprising:
receiving signals for accessing memory locations in each of the first and the second memory arrays at the second interface during a fourth time interval while the first interface is disabled from accessing each of the first and the second memory arrays, wherein at least one of a signaling rate of a signal received by the first interface, a supply voltage of the first interface, an on-chip termination impedance provided by the first interface, and a voltage amplitude of a signal received by the first interface is adjusted during the fourth time interval.

17. The method of claim 16 further comprising:
receiving a signal for accessing a memory location in the first memory array at the first interface during a fifth time interval after the fourth time interval; and
receiving a signal for accessing a memory location in the second memory array at the second interface during the fifth time interval,
wherein at least one of the signaling rate of a signal received by the first interface, the supply voltage of the first interface, the on-chip termination impedance provided by the first interface, and the voltage amplitude of a signal received by the first interface is different during the fifth time interval relative to the first, the second, and the third time intervals.

18. The method of claim 14, wherein receiving a signal for accessing a memory location in one of the first and the second memory arrays at a first interface during a first time interval further comprises receiving first address signals for accessing memory locations in the first memory array at the first interface during the first time interval,
receiving a signal for accessing a memory location in one of the first and the second memory arrays at a second interface during the first time interval further comprises receiving second address signals for accessing memory locations in the second memory array at the second interface during the first time interval, and
wherein receiving signals for accessing memory locations in each of the first and the second memory arrays at the first interface during a second time interval further comprises receiving third address signals for accessing memory locations in each of the first and the second memory arrays at the first interface during the second time interval.

19. The method of claim 14, wherein receiving a signal for accessing a memory location in one of the first and the second memory arrays at a first interface during a first time interval further comprises receiving a first timing signal for the first memory array at the first interface during the first time interval,
wherein receiving a signal for accessing a memory location in one of the first and the second memory arrays at a second interface during the first time interval further comprises receiving a second timing signal for the second memory array at the second interface during the first time interval, and
wherein receiving signals for accessing memory locations in each of the first and the second memory arrays at the first interface during a second time interval further comprises receiving a third timing signal for the first memory array and a fourth timing signal for the second memory array at the first interface during the second time interval.

20. The method of claim 14, wherein receiving a signal for accessing a memory location in one of the first and the second memory arrays at a first interface during a first time interval further comprises receiving first data signals for storing data in the first memory array at the first interface during the first time interval,
wherein receiving a signal for accessing a memory location in one of the first and the second memory arrays at a second interface during the first time interval further comprises receiving second data signals for storing data in the second memory array at the second interface during the first time interval, and
wherein receiving signals for accessing memory locations in each of the first and the second memory arrays at the first interface during a second time interval further comprises receiving third data signals for storing data in the first memory array and fourth data signals for storing data in the second memory array at the first interface during the second time interval.

21. The method of claim 14 further comprising:
transmitting a first data signal indicating data accessed from the first memory array at the first interface during the first time interval;
transmitting a second data signal indicating data accessed from the second memory array at the second interface during the first time interval; and
transmitting a third data signal indicating data accessed from the first and the second memory arrays at the first interface during the second time interval.

* * * * *